United States Patent
Fomenkov et al.

(10) Patent No.: US 7,079,556 B2
(45) Date of Patent: *Jul. 18, 2006

(54) BANDWIDTH CONTROL TECHNIQUE FOR A LASER

(75) Inventors: Igor V. Fomenkov, San Diego, CA (US); Armen Kroyan, San Diego, CA (US); Jesse D. Buck, San Marcos, CA (US); Palash P. Das, Vista, CA (US); Richard L. Sandstrom, Encinitas, CA (US); Frederick G. Erie, Encinitas, CA (US); John Martin Algots, San Diego, CA (US); Gamaralalage G. Padmabandu, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 259 days.

This patent is subject to a terminal disclaimer.

(21) Appl. No.: 10/670,406

(22) Filed: Sep. 24, 2003

(65) Prior Publication Data

US 2004/0057474 A1    Mar. 25, 2004

Related U.S. Application Data

(60) Division of application No. 09/608,543, filed on Jun. 30, 2000, now Pat. No. 6,721,340, which is a continuation-in-part of application No. 09/597,812, filed on Jun. 19, 2000, now Pat. No. 6,529,531, and a continuation-in-part of application No. 09/501,160, filed on Feb. 9, 2000, now Pat. No. 6,621,846, which is a continuation-in-part of application No. 08/898,630, filed on Jul. 22, 1997, now Pat. No. 6,078,599.

(51) Int. Cl.
*H01S 3/09* (2006.01)
*H01S 3/10* (2006.01)

(52) U.S. Cl. .......................................... 372/9; 372/102

(58) Field of Classification Search .................... None
See application file for complete search history.

(56) References Cited

U.S. PATENT DOCUMENTS

| 4,697,270 A | 9/1987 | Galkowski | 372/34 |
| 4,798,467 A | 1/1989 | Wyeth et al. | 356/349 |

(Continued)

FOREIGN PATENT DOCUMENTS

| WO | WO98/52261 | 11/1998 | 3/137 |

OTHER PUBLICATIONS

Ishihara, T., et al., "Advanced Krypton Fluoride Excimer Laser for Microlithography," *SPIE* vol. 1674, Optical/Laser Microlithography V (1992) pp. 473-485.

*Primary Examiner*—James Vannucci
(74) *Attorney, Agent, or Firm*—William Cray

(57) ABSTRACT

A technique for bandwidth control of an electric discharge laser. Line narrowing equipment is provided having at least one piezoelectric drive and a fast bandwidth detection means and a bandwidth control having a time response of less than about 1.0 millisecond. In a preferred embodiment wavelength tuning mirror is dithered at dither rates of more than 500 dithers per second within a very narrow range of pivot angles to cause a dither in nominal wavelength values to produce a desired effective bandwidth of series of laser pulses.

14 Claims, 20 Drawing Sheets

U.S. PATENT DOCUMENTS

| | | | |
|---|---|---|---|
| 4,817,101 A | 3/1989 | Wyeth et al. ................. 372/32 |
| 4,823,354 A | 4/1989 | Znotins et al. ................ 372/57 |
| 4,881,231 A | 11/1989 | Jain ............................. 372/32 |
| 4,883,352 A | 11/1989 | Bruning ...................... 353/122 |
| 4,940,331 A | 7/1990 | Wyeth et al. ............... 356/349 |
| 5,025,445 A | 6/1991 | Anderson et al. ............. 372/20 |
| 5,095,492 A | 3/1992 | Sandstrom .................. 372/102 |
| 5,128,601 A | 7/1992 | Orbach et al. ................ 372/30 |
| 5,371,587 A | 12/1994 | de Groot et al. ............ 356/349 |
| 5,373,515 A | 12/1994 | Wakabayashi et al. ........ 372/20 |
| 5,420,877 A | 5/1995 | Sandstrom ................... 372/34 |
| 5,440,578 A | 8/1995 | Sandstrom ................... 372/59 |
| 5,450,207 A | 9/1995 | Fomenkov ................... 356/416 |
| 5,524,144 A | 6/1996 | Suzuki ........................ 359/176 |
| 5,691,989 A | 11/1997 | Rakuljic ....................... 372/20 |
| 5,706,301 A | 1/1998 | Lagerström .................. 372/32 |
| 5,754,571 A | 5/1998 | Endoh et al. ................. 372/20 |
| 5,852,621 A | 12/1998 | Sandstrom ................... 372/25 |
| 5,870,420 A | 2/1999 | Webb ......................... 372/58 |
| 5,970,082 A | 10/1999 | Ershov ....................... 372/102 |
| 5,978,405 A | 11/1999 | Juhasz et al. ................. 372/57 |
| 5,991,324 A | 11/1999 | Knowles et al. .............. 372/57 |
| 6,005,879 A | 12/1999 | Sandstrom et al. ........... 372/25 |
| 6,094,448 A | 7/2000 | Fomenkov et al. ......... 372/102 |
| 6,128,323 A | 10/2000 | Myers et al. ................. 372/38 |
| 6,263,002 B1 | 7/2001 | Hsu et al. ...................... 372/6 |
| 6,348,357 B1 | 2/2002 | Sano .......................... 438/16 |
| 6,526,086 B1 | 2/2003 | Wakabayashi et al. ........ 372/69 |
| 6,721,340 B1 * | 4/2004 | Fomenkov et al. ........... 372/25 |

* cited by examiner

BANDWIDTH CONTROL TECHNIQUE FOR A LASER

FIELD OF THE INVENTION

This application is a divisional of Ser. No. 09/608,543 filed Jun. 30, 2000 now U.S. Pat. No. 6,721,340 which is a continuation-in-part of Ser. No. 09/597,812 filed Jun. 19, 2000, now U.S. Pat. No. 6,529,531 which was a continuation-in-part of Ser. No. 08/898,630 filed Jul. 22, 1997 now U.S. Pat. No. 6,078,599 and Ser. No. 09/501,160 filed Feb. 9, 2000 now U.S. Pat. No. 6,621,846. This invention relates to lasers and, in particular, to techniques for control of the bandwidth of the output beam.

BACKGROUND OF THE INVENTION

Wavelength Control

Lasers are used for many applications. For example, lasers, such as KrF and ArF excimer lasers, are used in stepper and scanner equipment for selectively exposing photoresist in a semiconductor wafer fabrication process. In such fabrication processes, the optics in the steppers and scanners are designed for a particular wavelength of the laser. The laser wavelength may drift over time and, thus, a feedback network is typically employed to detect the wavelength of the laser and correct the wavelength as necessary.

In one type of feedback network used to detect and adjust the wavelength of a laser, an etalon receives a portion of the emitted light from the laser. The etalon creates an interference pattern having concentric bands of dark and light levels due to destructive and constructive interference by the laser light. The concentric bands surround a center bright portion. The position of the bright center portion of the interference pattern is used to determine wavelength to a relatively coarse degree, such as to within 5 picometers (pm). The diameter of a light band is used to determine the wavelength of the laser to a fine degree, such as to within 0.01–0.03 pm. The width of a light band is used to determine the spectral width of the laser output. The interference pattern is usually referred to as a fringe pattern. The fringe pattern may be optically detected by a sensitive photodetector array.

Various methods are well known for wavelength tuning of lasers. Typically the tuning takes place in a device referred to as a line narrowing package or line narrowing module. A typical technique used for line narrowing and tuning of excimer lasers is to provide a window at the back of the discharge cavity through which a portion of the laser beam passes into the line narrowing package. There, the portion of the beam is expanded in a beam expander and directed to a grating which reflects a narrow selected portion of the laser's natural broader spectrum back into the discharge chamber where it is amplified. The laser is typically tuned by changing the angle at which the beam illuminates the grating. This may be done by adjusting the position of the grating or providing a mirror adjustment in the beam path. The adjustment of the grating position or the mirror position may be made by a mechanism which we will refer to as a laser wavelength adjustment mechanism.

In the prior art, the typical feedback network is configured to maintain the nominal wavelength within a desired range of wavelengths. Typical specifications may establish this range at values such as +/−0.05 pm of a target wavelength such as, for example, 248,327.1 pm, as applied to the average of the wavelengths of a series of pulses referred to as "pulse window". A typical pulse window would be 30 pulses. Another typical specification is the standard deviation of the measured wavelength values for a series of pulses (such as 30 pulses). This value is referred to as sigma, .PHI., and is calculated using the standard formula for standard deviations. Also, sometime specifications are in terms of 3 .PHI. which is merely three times the measured standard deviation. Typical 3 .PHI. specifications may be 0.15 pm.

The limitations of acceptable optical lens materials for use with deep ultraviolet light at 248 nm and 193 nm wavelengths have meant that projection lenses for KrF and ArF lithography have been fabricated primarily with fused silica. Although fused silica is a very good lens material (high transparency, low thermal expansion, relatively easy to polish), the unavailability of a second material type with a different refractive index in projection lenses results in chromatic aberrations. Chromatic aberrations emerge since the index of refraction of any optical material changes with wavelength, and hence, the imaging behavior of a lens also varies with wavelength.

The detrimental effects of chromatic aberrations for an uncorrected lens can be mitigated only by using a light source with a very narrow range of wavelengths. Spectral line-narrowed excimer lasers have served this purpose for deep-UV lithography. Today's lasers have bandwidths in the subpicometer range, providing nearly monochromatic illumination for refractive projection lenses. Nevertheless, although excimer laser bandwidths are small, the lack of chromatic correction in lenses means that the bandwidth cannot be ignored.

The bandwidth of the laser beam is typically made small by the use of line narrowing package referred to above. In the past, laser specifications have required the band width to be smaller than a specified value such as 0.5 pm. Specifications are also directed at the 95 percent integral bandwidth. A typical 95% I specification would be less than 1.2 ppm. However, recently integrated circuit manufacturers have noticed that the quality of their integrated circuits can be adversely affected by bandwidths which are substantially narrower than the bandwidths for which their optical systems were designed.

What is needed are techniques to control laser bandwidths within specified ranges rather than merely less than a specified width.

SUMMARY OF THE INVENTION

The present invention provides a technique for bandwidth control of an electric discharge laser. Line narrowing equipment is provided having at least one piezoelectric drive and a fast bandwidth detection means and a bandwidth control having a time response of less than about 2.0 millisecond. In a preferred embodiment wavelength tuning mirror is dithered at dither rates of more than 500 dithers per second within a very narrow range of pivot angles to cause a dither in nominal wavelength values to produce a desired effective bandwidth of series of laser pulses.

DETAILED DESCRIPTION OF PREFERRED EMBODIMENTS

Simulation

Figure 1:
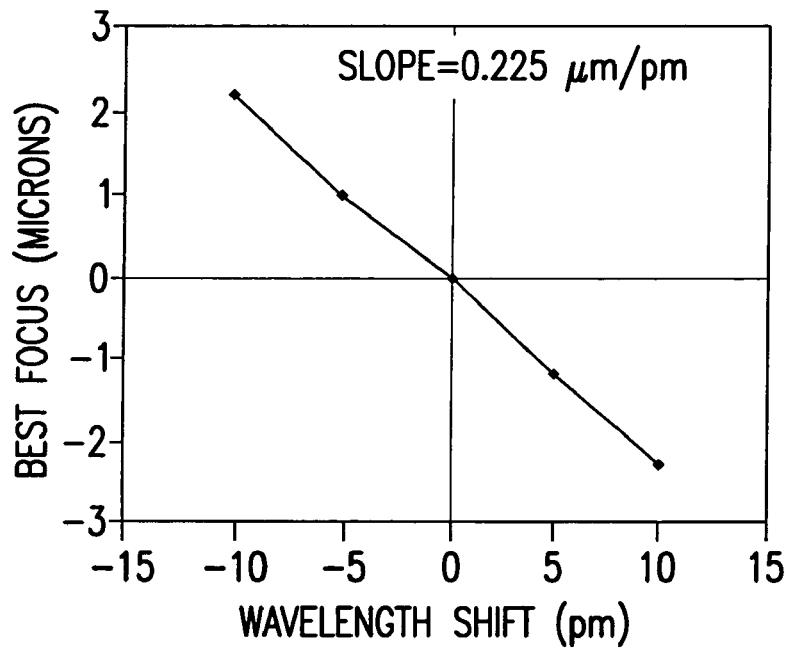
FIG. 1 is a graph showing the variation of best focus with wavelength.

Simulation of the effects of wavelength and bandwidth changes have been performed by Applicants. The main effect of changing the exposure wavelength for a non-chromatic corrected lens is a change in the position of the focal plane. Over a fairly wide range of wavelengths, this change in focus is essentially linear with the change in the nominal wavelength (i.e., the central wavelength of the illumination spectrum). The wavelength response of a lens can be determined experimentally by manually changing the central wavelength of the laser and using the imaging sensor of the stepper to monitor the shift in focus that results. FIG. 1 shows an example of such a measurement.

Given the change in focus with change in wavelength, the use of a broadband illumination spectrum means that each wavelength in the spectrum will produce an aerial image with a different best focus. The total aerial image will be a sum of the aerial images at each focal position, weighted by the relative intensity of each wavelength in the illumination spectrum. This technique is based on multiple focal plane exposures. Latest versions of a computer program PROLITH/2 (available from FINLE Technologies, Inc., with offices in Austin, Tex.,) incorporate these types of effects.

Figure 2:
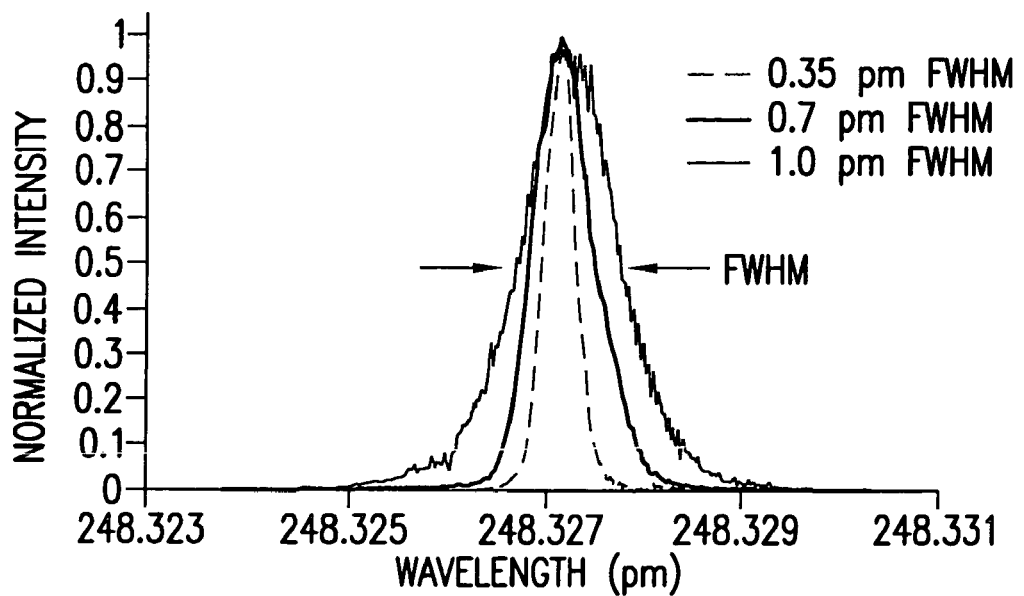
FIG. 2 shows typical narrow band gas discharge laser spectra.

Actual laser spectra measured on a variety of commercially available lasers were used in this work to characterize laser spectra. FIG. 2 illustrates examples of different KrF laser spectra.

Figure 3:
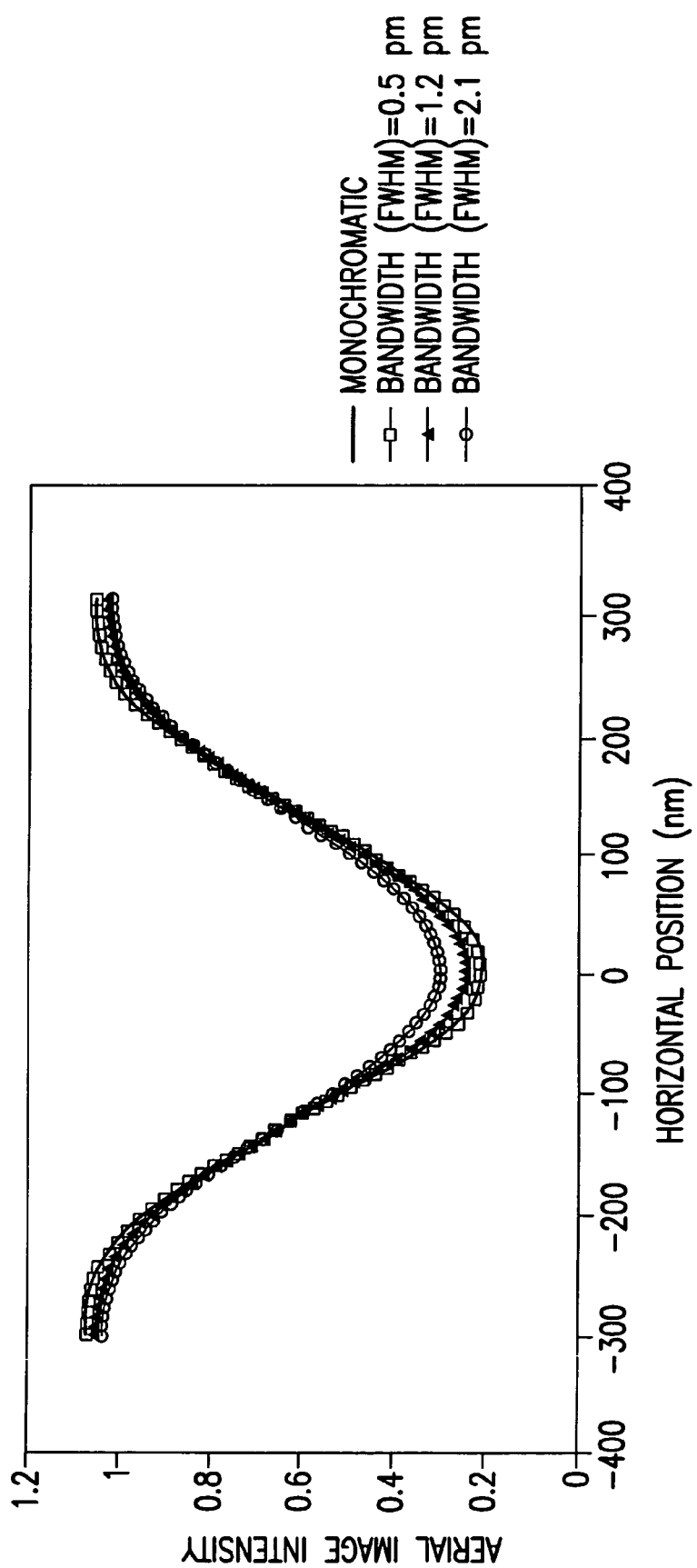
FIG. 3 shows the variation of aerial image intensity with bandwidth.

In order to understand the impact of laser bandwidth on the lithographic process in the presence of chromatic aberrations, we started from investigation of the aerial image of a 180 nm isolated line. FIG. 3 shows how changing bandwidth affects the aerial image. (The image dimension is usually assumed to correspond to the 0.3 image intensity values.) For these simulations the following input parameters were used: NA=0.6, $\sigma$=0.75, $\lambda_0$=248.3271 mm Laser spectra with 0.5 pm, 1.2 pm, 2.1 pm bandwidths at FWHM and a monochromatic light source were used in this simulation study, and a chromatic aberration focus response of 0.225 $\mu$m/pm was assumed. As can be seen in FIG. 3, changes in the bandwidth causes noticeable changes in the image intensity.

Figure 4A:
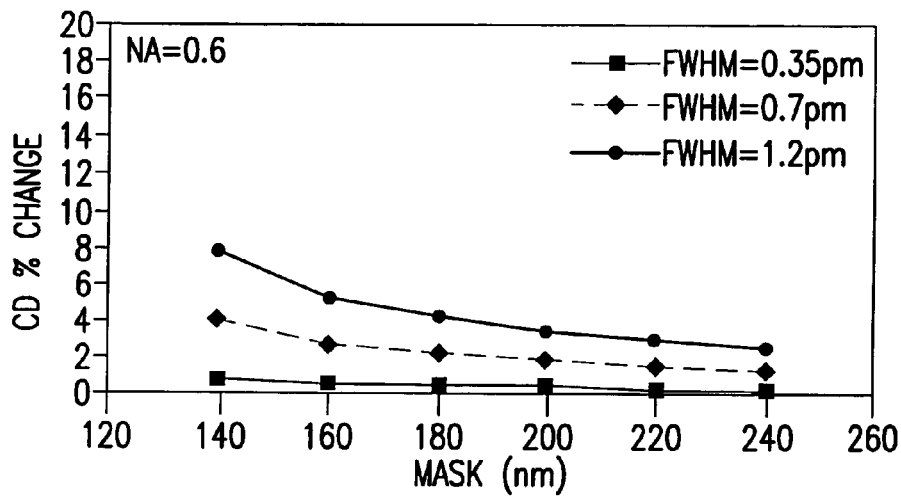
FIGS. 4A, 4B and 4C shows variation of the change in critical dimension with bandwidth.
Figure 4B:
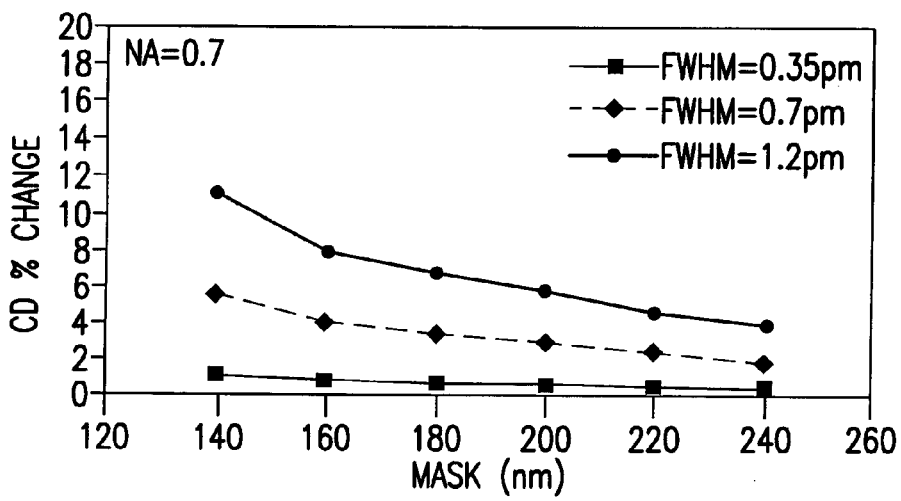
Figure 4C:
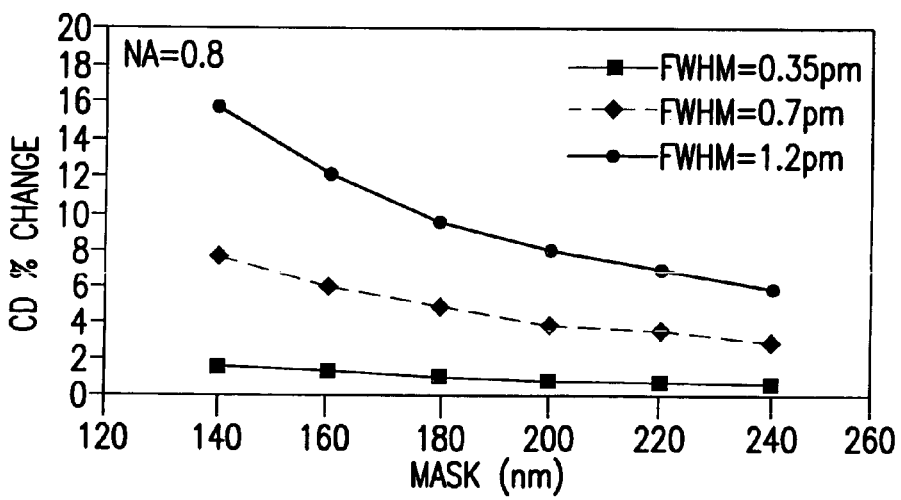

The impact of laser bandwidths on critical dimensions (CD) variations of isolated lines with different sizes was evaluated using an aerial image threshold model. In this study the following input parameter settings were used: $\sigma$=0.75, $\lambda_0$=248.3271 nm aerial image threshold at 30%, NA=0.6, 0.7, and 0.8. The simulations were performed for isolated lines ranging from 240 nm to 140 nm. The chromatic aberration response was assumed at 0.225 $\mu$m/pm. As shown in FIGS. 4A, 4B and 4C, changes in the bandwidth (either increases or decreases) can result in substantial changes in the critical dimensions of the integrated circuit lines especially at higher numerical aperture values.

Bandwidth Depends on $F_2$ Concentration

It is known that both laser efficiency and bandwidth of an excimer laser can vary significantly with fluorine concentration. This variation can be significant because fluorine concentration in a typical excimer laser is depleted by about 0.1–1 percent per hour when operating at a typical duty factor in a lithography system. A typical method of laser control maintains a constant pulse energy output while the fluorine depletes by permitting the discharge voltage to increase gradually under the influence of a pulse energy feedback system for a period of about 2–4 hours until the fluorine concentration has decreased by about 10%. At this time fluorine is injected and the pulse energy feedback control system immediately decreases the discharge voltage. A consequence of this method of operation is significant swings in the bandwidth which is, as stated above affects the bandwidth and the change in bandwidth in turn affects the integrated circuit pattern in the manner indicated in FIG. 1.

One technique for minimizing hourly fluctuations in bandwidth values is to maintain the fluorine concentration at approximately constant values. This can be done by injecting fluorine continuously at very low rates corresponding to depletion or making "micro injections" at very frequent intervals to in effect simulate continuous injection.

Wavelength Correction Equipment

Figure 5:
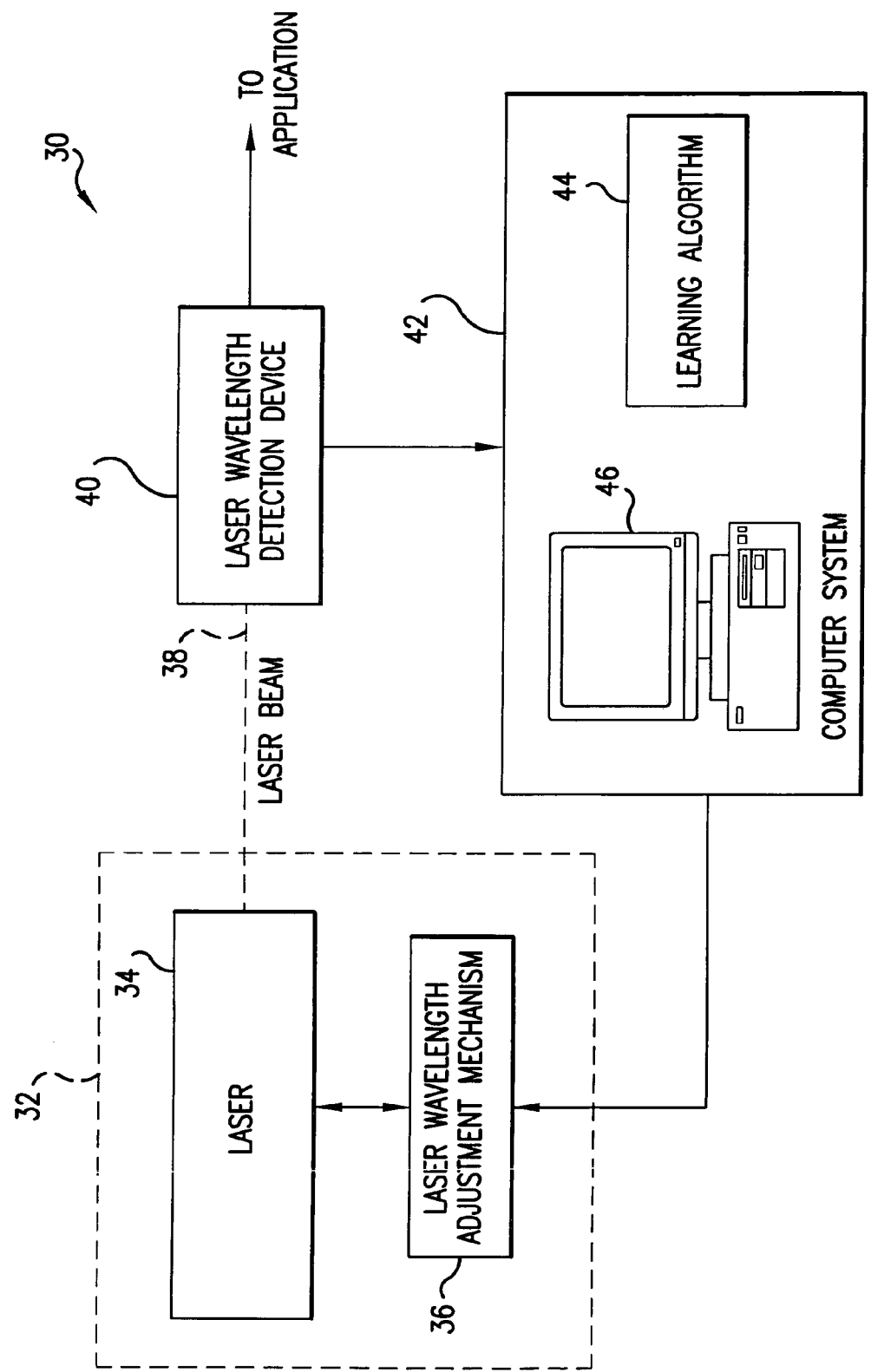
FIG. 5 is a block diagram of a narrow band laser system.

FIG. 5 illustrates the preferred embodiment of a wavelength shift correction system 30 for a laser system 32. Laser system 32 includes a tunable laser 34. In one embodiment, laser 34 is an ultraviolet (UV) excimer laser which emits pulses of laser energy. Laser system 32 also includes a laser wavelength adjustment mechanism 36 to adjust the wavelength of laser 34. In one embodiment, laser wavelength adjustment mechanism 36 is capable of tuning laser 34 over a limited but relatively large tunability range in a period of about 10–20 ms. Smaller adjustments can be made much quicker. Laser wavelength adjustment mechanism 36 may be any known laser wavelength adjustment mechanism. In the preferred embodiment, laser wavelength adjustment mechanism 36 includes a stepper motor or piezoelectric transducer controlling the angle at which a laser beam being tuned illuminates a grating located in a line narrowing module. The grating reflects a narrow range of wavelengths back into the laser excitation chamber for duplication. These wavelength adjustment mechanisms are well known in the art.

Laser Wavelength Detection

As laser 34 is being operated in an application, such as in a stepper for wafer fabrication, a portion of its emitted laser beam 38 is directed to a laser wavelength detection device 40. Laser wavelength detection device 40 may be a conventional device which detects the wavelength of laser beam 38. Further details regarding a suitable laser and optical elements for detecting and tuning the wavelength of laser light may be found in the following patents assigned to the present assignee and incorporated herein by reference: U.S. Pat. No. 5,025,445, entitled System For, and Method of, Regulating the Wavelength of a Light Beam, by Stuart Anderson et al.; U.S. Pat. No. 5,420,877, entitled Temperature Compensation Method and Apparatus for Wave Meters and Tunable Lasers Controlled Thereby, by Richard Sandstrom et al.; U.S. Pat. No. 5,095,492, entitled Spectral Narrowing Technique, by Richard Sandstrom; and U.S. Pat. No. 5,450,207, entitled Method and Apparatus for Calibrating a Laser Wavelength Control Mechanism, by Igor Fomenkov. The precise technique used to provide accurate wavelength detection is not relevant to this invention.

Laser wavelength detection device 40 accurately converts certain characteristics of laser beam 38 into digital signals for use by additional processing circuitry, such as a chirp acquisition system 42 described in detail below. The additional processing circuitry may use the digital signals to control the wavelength of tunable laser 34 and to determine various other characteristics of laser beam 38. Laser 34 may be tuned mechanically, optically, or chemically (e.g., by controlling the mixture of gases in laser 34), and the precise method used to tune the laser is not relevant to this invention.

In one embodiment, laser 34 emits pulses at 1000 pulses per second or greater. Ideally, laser wavelength detection device 40 detects the wavelength of each pulse in a burst of pulses from laser 34. Alternatively, laser wavelength detection device 40 may detect the wavelength of a sampled subset of pulses in the burst of pulses from laser 34.

Any technique used in the industry or described in any publication may be used in order to determine the wavelength of a pulse of laser beam 38 to an accuracy of, in one embodiment, 0.01–0.03 pm. Examples of various wavelength detection techniques and devices are described in the patents previously mentioned, incorporated herein by reference.

Fast Wavelength Correction Using Piezoelectric Transducer

FIGS. 6 through 11, FIGS. 12A through 12D, FIGS. 13A and 13B describe techniques for very fast correction of the wavelength taking advantage of the extremely fast response of a piezoelectric transducer to pivot the tuning mirror.

Fast Wave Meter

In order to provide rapid control of wavelength such as at time intervals shorter than the time between pulses (0.5 ms for a 2000 Hz laser) it is desirable to be able to measure the wavelength faster than the time between pulses. Typical prior art lithography lasers require almost 2 ms to measure the wavelength. A description of a wavemeter and a technique for measuring wavelength is provided in U.S. Pat. No. 5,991,324 which is incorporated herein by reference. The following is a description of a similar wavemeter which has been modified to record the necessary data and perform the necessary calculation to determine wavelength at speeds of less than 420 microseconds.

Figure 6:
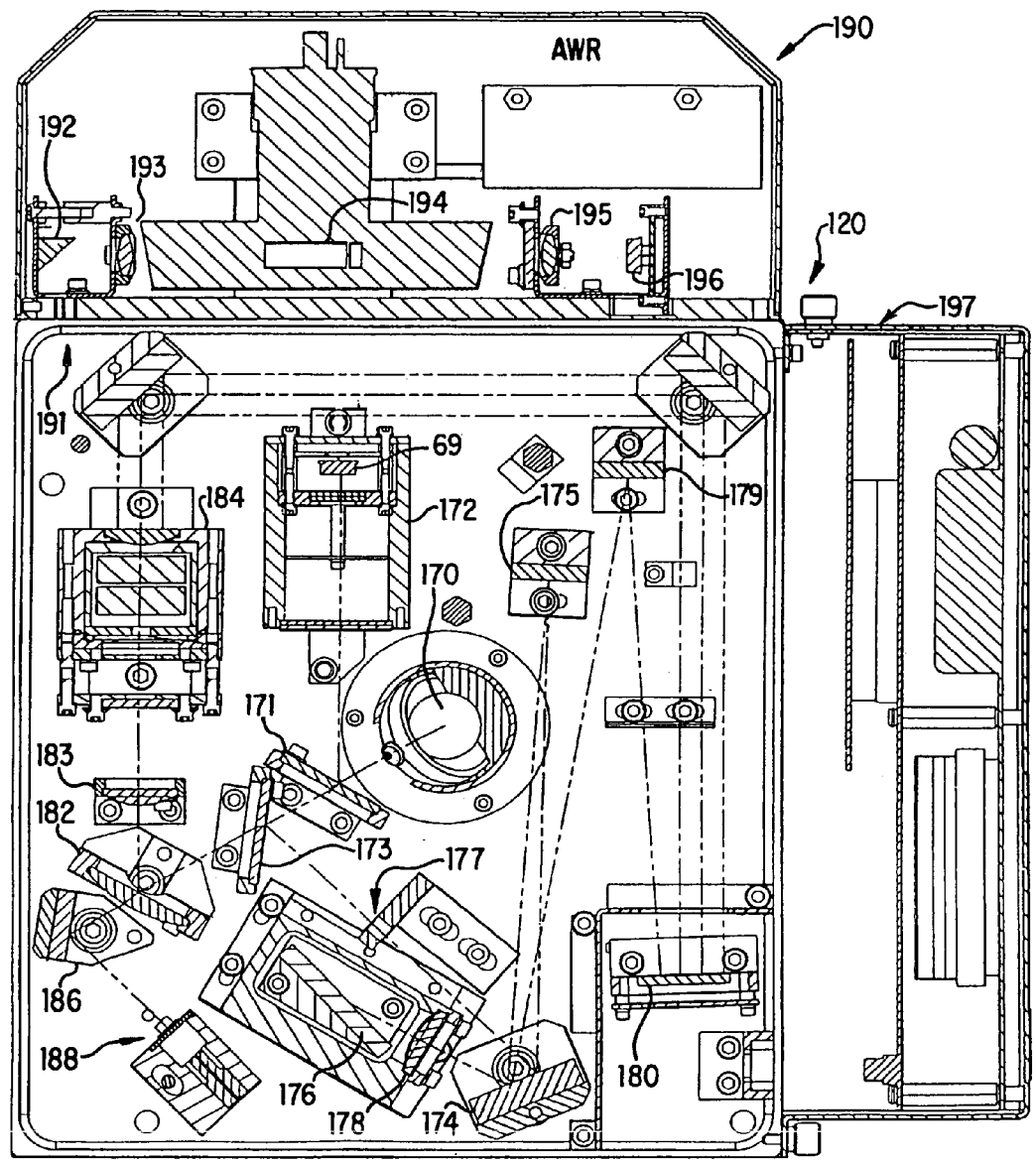
FIG. 6 is a drawing of a wavemeter.

As shown in FIG. 6, the output beam from the laser chamber intersects partially reflecting mirror 170, which passes about 95.5% of the beam energy and reflects about 4.5% into wavemeter 120.

About 4% of the reflected beam is reflected by mirror 171 to energy detector 172 which comprises a very fast photo cell 92 which is able to measure the energy of individual pulses occurring at the repetition rate of 4,000 pulses per second or greater. A typical pulse energy is about 10 mJ and the output of detector 69 is fed to computer controller 102 (FIG. 12) which uses a special algorithm (described in U.S. Pat. No. 6,005,879, incorporated herein by reference) to adjust the laser charging voltage to precisely control the pulse energy of future pulses based on stored pulse energy data in order to limit the variation of the energy of individual pulses and the integrated energy of bursts of pulses, all as described hereinafter.

About 4% of the beam which passes through mirror 171 is reflected by mirror 173 through slit 177 to mirror 174, to mirror 175, back to mirror 174 and onto eschelle grating 176. The beam is collimated by lens 178 having a focal length of 458.4 mm. Light reflected from grating 176 passes back through lens 178, is reflected again from mirrors 174, 175 and 174 again and then is reflected from mirror 179 and focused onto the left side of linear photo diode array 180. The position of the beam on the photo diode array is a coarse measure of the relative nominal wavelength of the output beam. About 90% of the beam which passes through mirror 173 is reflected off mirror 182 through lens 183 into etalon 184. The beam exiting etalon 184 is focused by a 458.4 mm focal length lens in the etalon and produces interference fringes on the middle and right side of linear photo diode array 180 after being reflected off two mirrors as shown in FIG. 6.

Linear Photo Diode Array

Linear photo diode array 180 is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long. Photo diode arrays such as this are available from several sources. A preferred supplier is Hamamatsu. In one preferred embodiment, we use a Model S3903-1024 which can be read at the rate of $2.5 \times 10^6$ pixels/sec on a FIFO basis in which complete 1024 pixel scans can be read at rates greater than 2000 Hz. A faster array is Model RL 2048 PAQ supplied by EG&G Reticon with offices in Sunnyvale, Calif. This PDA can be read at 2,048 pixels at a 16.875 kilohertz frame rate.

Calculation of Coarse Wavelength

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$\lambda = (2.3 \text{ pm/pixel})P + 248{,}350 \text{ pm}$ where P=coarse image central positions

Fast Calculation of Fine Wavelength

The spectrometer must measure wavelength and bandwidth substantially in real time. Because the laser repetition rate may be 2 kHz or higher, it is necessary to use algorithms which are accurate but not computationally intensive in order to achieve the desired performance with economical and compact processing electronics. Preferably, Applicants use integer as opposed to floating point math, and operations are all linear (or use of square root, sine, log, etc.).

Figure 6A:
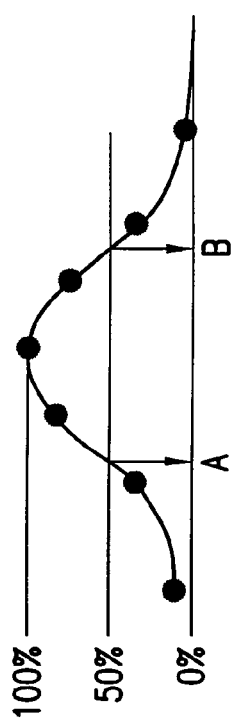
FIGS. 6A and 6B show how bandwidth and wavelength are calculated.
Figure 6B:
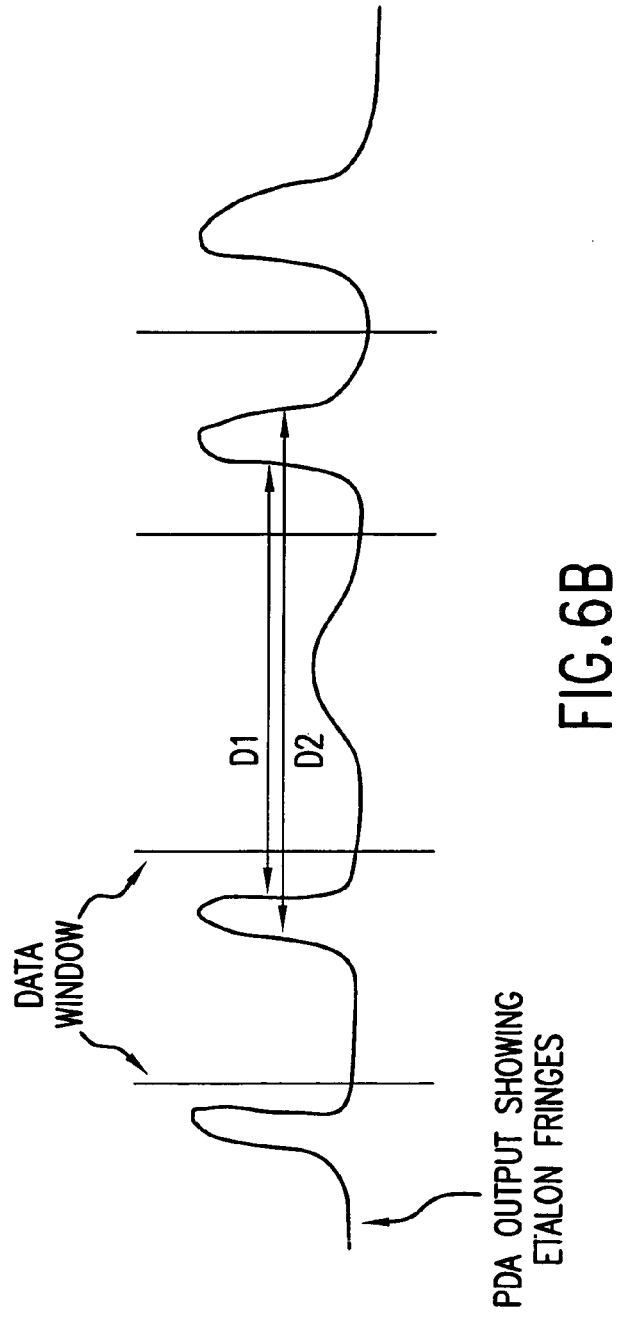

The specific details of a preferred algorithm used in this preferred embodiment will now be described. FIG. 6B is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks determines the wavelength, while their width measures the bandwidth of the laser. A region labeled "data window" is shown in FIG. 6B. The data window is located so that the fringe nearest the central peak is normally used for the analysis. However, when the wavelength changes to move the fringe too close to the central peak (which will cause distortion and resulting errors), the second closest peak will be inside the data window, and the software will jump to that peak. Conversely, when the wavelength shifts to move the current peak outside the data window away from the central peak the software will jump to an inner fringe within the data window.

The steps involved are as follows:

1. After a laser pulse, the photo diode array output is electronically read out and digitized. Data points are separated by an interval physically determined by the spacing of the photo diode array elements, in this case 25 micrometer pitch.
2. The digital data is searched to find the peak intensity value in the data window. The previous peak location is used as a starting point. Small regions are searched left and right of the starting point. The search region is extended by small intervals left and right until a peak is found. If the peak is outside the data window, the search will automatically continue until the other peak is found.
3. Based on the intensity of the peak, a 50% level is computed as shown in FIG. 6A. The 0% level is measured periodically between the pulses. Based on the computed 50% level, points are examined right and left of the peak until the data points which border the 50% level are found. A linear interpolation is computed between pairs of points, which border the 50% level to find the left and right half-maximum positions, labeled A, and B in FIG. 6A. These positions are computed to a fraction of a pixel such as $\tfrac{1}{16}$, using an integer data format.
4. Steps 2 and 3 are duplicated for the two data windows, giving a total of four interpolated 50% positions. As indicated FIG. 6B, two diameters are computed. D1 is the inner fringe diameter while D2 is the outer fringe diameter.
5. An approximation to the wavelength is determined by the coarse wavelength circuit, as described in the preceding section "Calculation of Coarse Wavelength."

Fine Wavelength Calculation

The inner and outer fringe diameters D1 and D2 (in units of pixels) are each converted to wavelength by the following equations:

$$\lambda = \lambda_0 + Cd(D^2 - D_0^2) + N \cdot FSR$$

where $\lambda$=wavelength corresponding to diameter D
$\lambda_0$=calibration wavelength
$D_0$=diameter corresponding to wavelength $\lambda_0$
Cd=calibration constant dependant on the optical design
FSR=free spectral range of the etalon
N=integer, =0, ±1, ±2, ±3 . . .

The values $\lambda_0$, $K_1$, FSR, and $D_0$ are determined and stored at the time of calibration. The value for N is chosen such that:

$$|\lambda - \lambda_c| \leq \tfrac{1}{2} FSR$$

where $\lambda_c$=coarse wavelength determination.

For example, in a preferred embodiment, we select a reference wavelength $\lambda_0$=248,327.1 pm (corresponding to an absorption line of an iron hollow cathode lamp). At this wavelength, the fringe diameter $D_0$ might be found to be 300 pixels. Cd is a constant which can either be directly measured or calculated from the optical design. In our preferred embodiment, $Cd = -9.25 \times 10^{-5}$ pm/pixel$^2$. Thus, for example, with the laser operating at a different wavelength, the fringe diameter may be measured to be 405 pixels. The possible wavelengths computed by equation (1) are:

$$\lambda = 248{,}327.1 \text{ pm} - 9.25 \times 10^{-5} \text{ pm/pixel}^2 [(405)^2 - (300)^2] + N \cdot FSR$$
$$= 248{,}333.95 + N \cdot FSR$$

If the free spectral range FSR=20 pm, then the possible values for $\lambda$ include:

| | |
|---|---|
| 248,293.95 pm | N = −2 |
| 248,313.95 pm | N = −1 |
| 248,333.95 pm | N = 0 |
| 248,353.95 pm | N = +1 |
| 248,373.95 pm | N = +2 |

If the coarse wavelength is measured to be $\lambda_c$=248,350, for example, then the processor will select the value $\lambda$=248,353.95 pm (N=+1) as the solution in the closest agreement with $\lambda_c$.

The inner and outer fringe diameters $D_1$ and $D_2$ as shown in FIG. 6B are each converted into wavelengths $\lambda_1$ and $\lambda_2$, respectively. The final value which is reported for the laser wavelength is the average of these two calculations:

$$\lambda = \left(\frac{\lambda_1 + \lambda_2}{2}\right)$$

Bandwidth Calculation

The bandwidth of the laser is computed as $(\lambda_2-\lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $\Delta\lambda\varepsilon$ is subtracted, which provides sufficient accuracy. Therefore, the bandwidth is:

$$\Delta\lambda = \left(\frac{D_2 - D_1}{2}\right) - \Delta\lambda\varepsilon$$

$\Delta\lambda\varepsilon$ depends on both the etalon specifications and the true laser bandwidth. It typically lies in the range of 0.1–1 pm for the application described here.

Wavelength Calibration

About 10% of that portion of the beam that passes through mirror 182 are reflected from mirror 186 into fiber optic input 188 and the light travels through an optical fiber to atomic wavelength reference 190. The optical fiber connects to atomic reference unit 190 at opening 191, and the light from the optical fiber reflects off mirror 192 and is focused by lens 193 to a focal point in the center of neon iron vapor cell 194, and is focused again by lens 195 onto photodiode 196. Atomic wavelength reference unit 190 is used to calibrate wavemeter 120. This is done by adjusting the wavelength of the laser while keeping the output energy constant as shown by detector 69 while monitoring the output of photodiode 196. When photodiode 196 shows a substantial reduction in output while photodiode 69 shows nominal output, the wavelength of the output must correspond to the iron vapor absorption line of 248.3271 nm. The position data corresponding to the etalon fringes and the position data corresponding to the image produced by grating 176 on linear photodiode 180 when the output of photodiode 196 is lowest is detected and recorded by wavemeter controller 197 and this data are used by wavemeter controller 197 to calibrate wavemeter 120.

Microprocessor for Wavelength Measurement

Since there are only 500 microseconds between pulses of a 2000 Hz laser, wavelengths must be calculated in significantly less than 500 microseconds in order to have an opportunity to correct an upcoming pulse for the wavelength error of the immediately preceding pulse. As stated above, the photodiode array 180 can be read at the rate of $2\times10^6$ pixels/second. The data is read into a buffer memory so that processing of the data can begin during the readout. The processing of the data required to perform the above calculation is preferable done with a Model 68332 25 MHz microprocessor supplied by Motorola Corporation. Applicants have determined that this inexpensive processor can be over clocked to run at 43 MHz with no deterioration in performance. In one preferred arrangement all data is read out from PDA 180 and the wavelength calculations described above are made in a period of 420 microseconds allowing 80 microseconds to move mirror 14 prior the next burst.

Correction of Bandwidth

The bandwidth measurements made by the spectrometer equipment shown in FIG. 6 provides bandwidth values that are different than the true bandwidth values because like all spectrometers has its own spectrum called a "slit function" which is the spectrum which it would display when monitoring a monochromatic beam.

Applicants have developed a technique for conservatively correcting the measured spectrum for the FIG. 6 equipment. This technique is described below.

Figure 15:
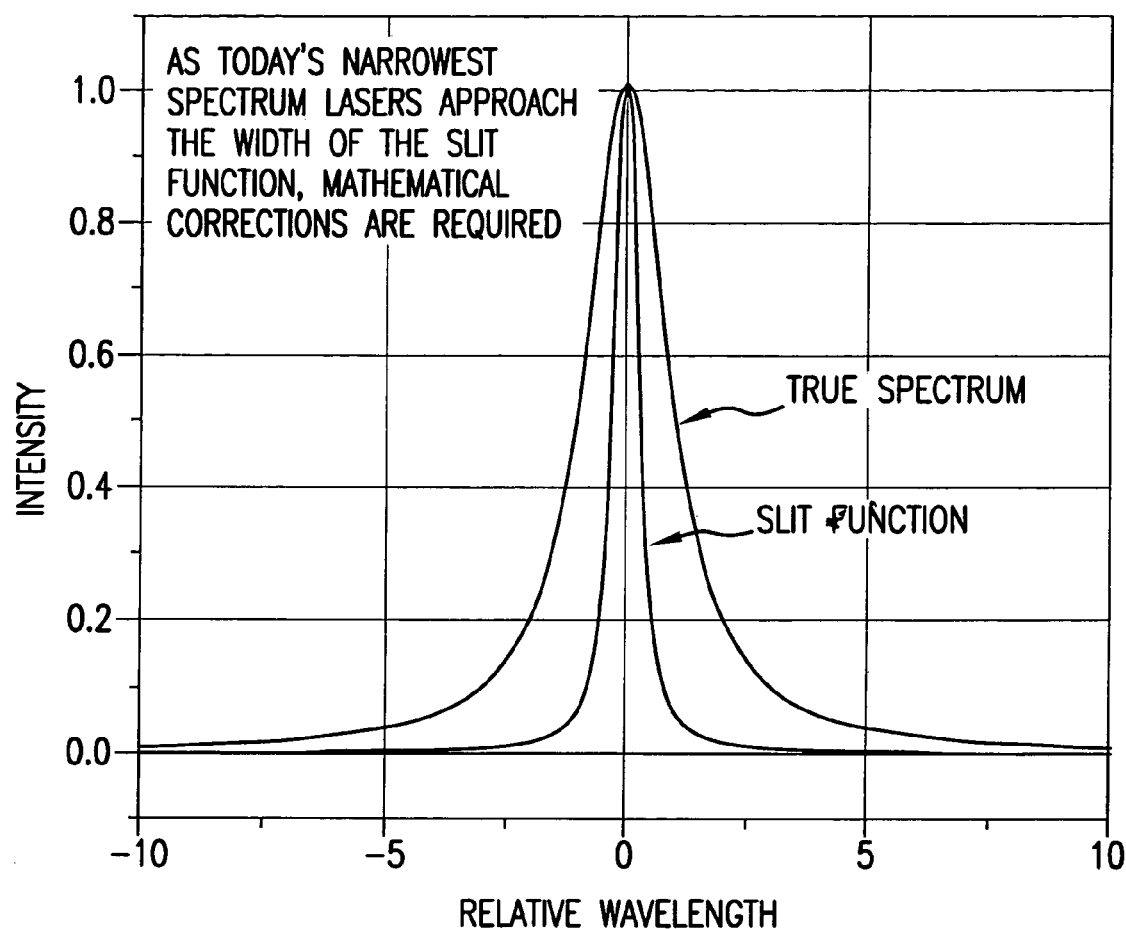
FIG. 15 shows a slit function as compared to a hypothetical true spectrum.

FIG. 15 shows qualitatively a typical spectrometer slit function and a hypothetical true spectrum. The measured spectrum would be a convolution of the slit function and the true spectrum of the laser beam. Thus, to determine the true spectrum from raw spectral data from a gas discharge laser, the slit function must be removed. This turns out mathematically to be very difficult to do.

Applicants conservative technique for correcting the raw spectral data is much simpler and more conservative than prior art techniques. It involves the following steps:
1) Measure the slit function of the spectrometer equipment using approximately monochromatic laser beam.
2) Measure the spectrum of an actual gas discharge laser with the same spectrometer.
3) Compute the width $W_R$ of the raw gas discharge laser spectral data measured by the spectrometer.
4) Convolve the slit function and the raw gas discharge laser data.
5) Compute the forward convolved width $W_{FC}$ of the resulting convolved spectrum.
6) Compute the approximate width WT of the true gas discharge laser spectrum using the formula:

$$W_T = W_R - (W_{FC} - W_R)$$

The W's may be any of several spectral widths such as FWHM or I95%.

Fast Mirror Adjustment

Figure 12:
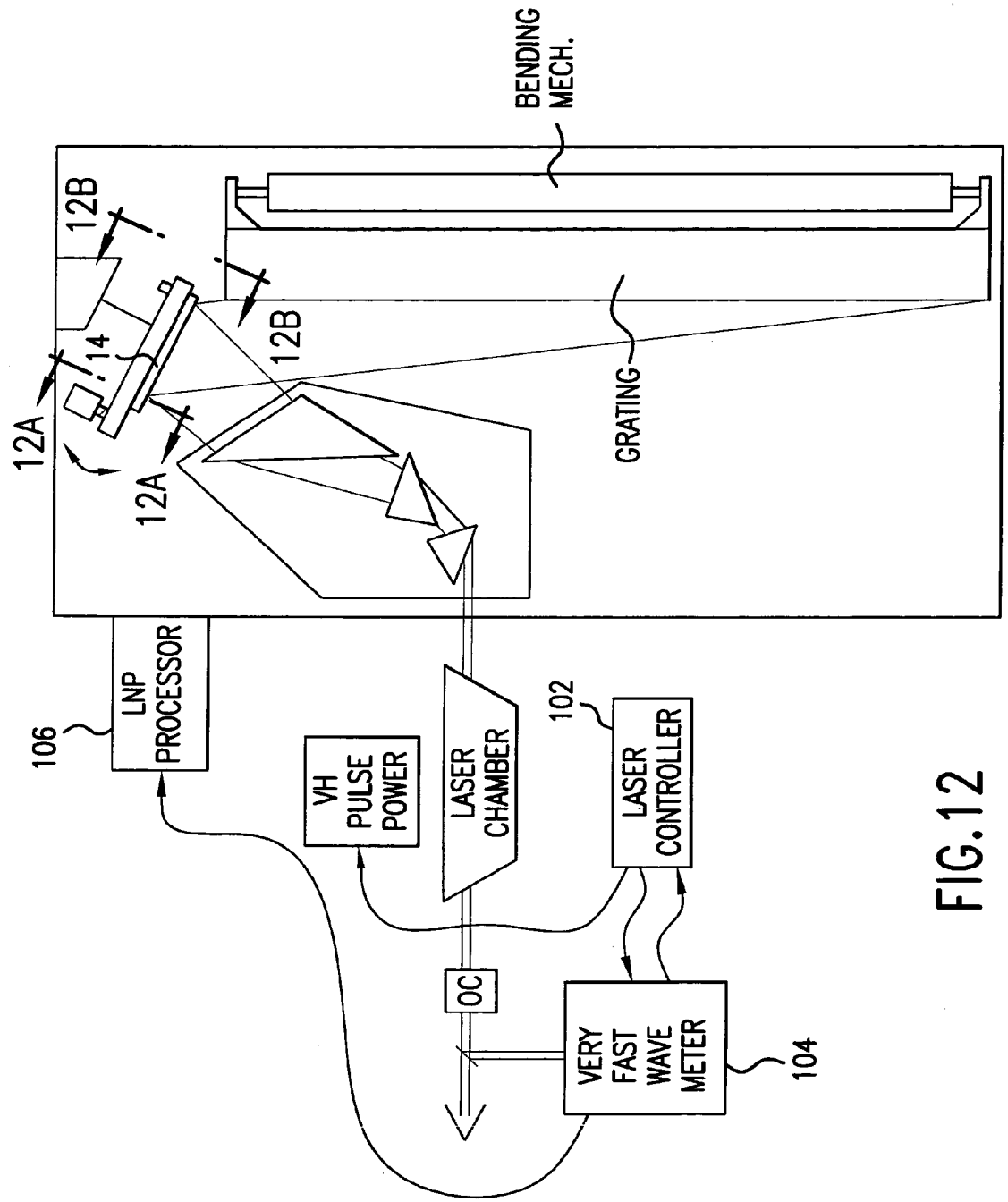
FIGS. 12, 12A, 12B, 12C and 12D show a proposed technique for providing fast and finer wavelength control.
Figure 12A:
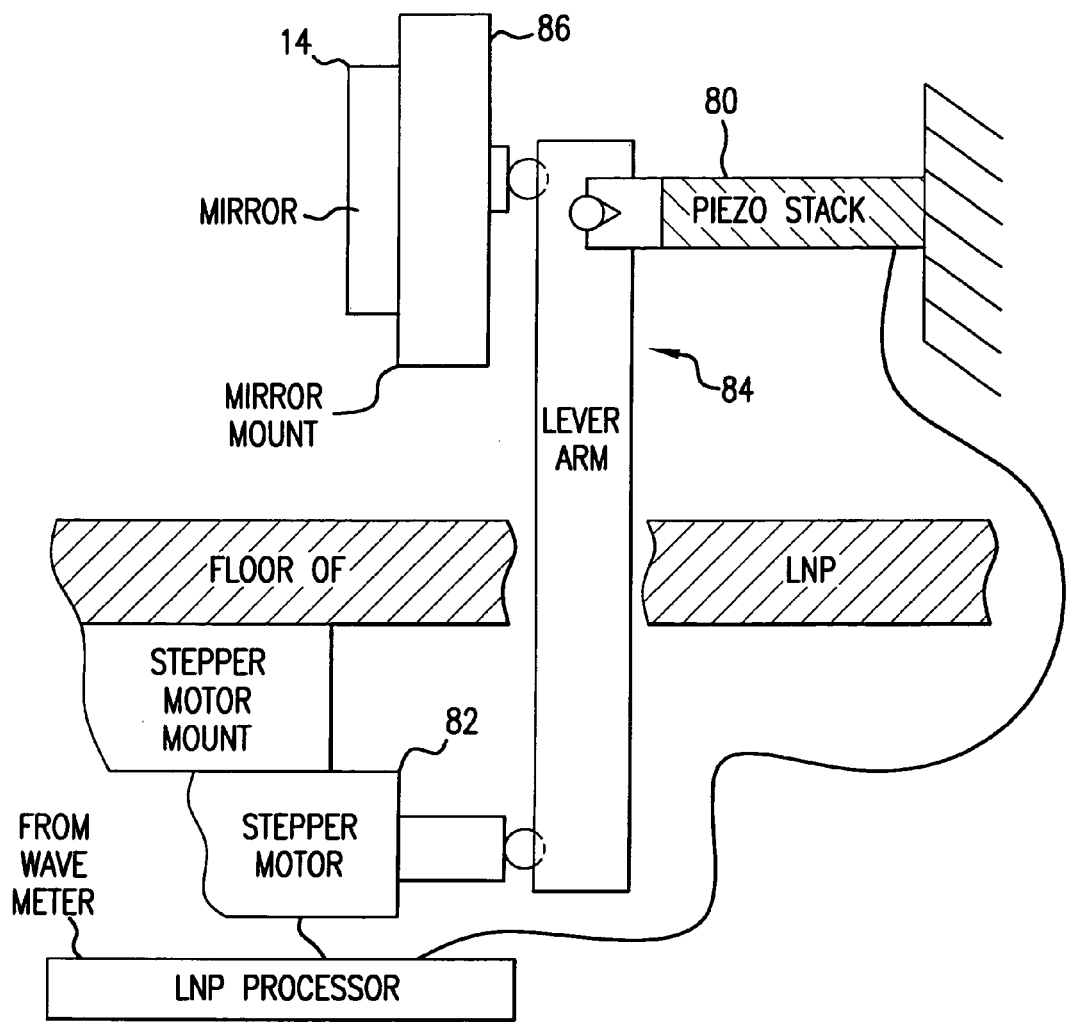
Figure 12B:
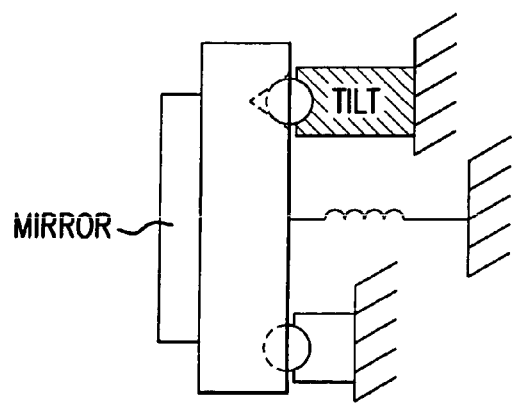
Figure 12C:
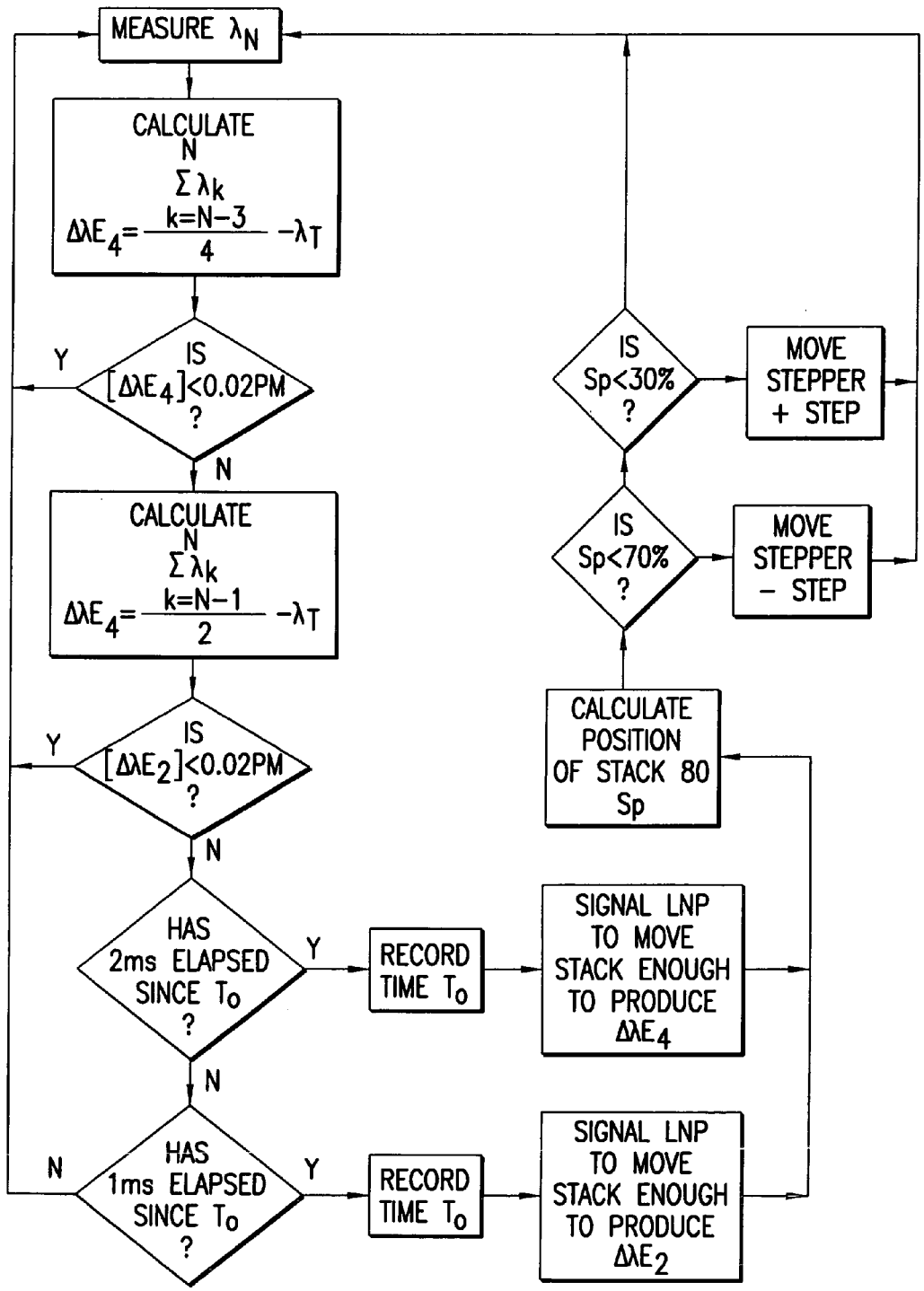

FIGS. 12, 12A and 12B show an arrangement permitting very fast adjustment of mirror 14. This embodiment is a major speed up as compared to the stepper motor drive system described above but not quite fast enough for pulse-to-pulse adjustment. As indicated above, earlier methods of mirror positioning required about 7 ms to move mirror 14, making pulse-to-pulse wavelength correction at 2000 Hz out of the question. In that earlier technique, a lever arm pivoted about a pivot axis to produce a 1 to 26.5 reduction in the mirror movement compared to the stepper position movement. The prior art stepper has a total travel of ½ inch (12.7 mm) and 6000 steps so that each step is a distance of about 2 microns. With the 1–26.5 reduction, one step moves the mirror about 75 nm which typically changes the wavelength of the laser wavelength about 0.1 pm. In the fast acting technique shown in FIG. 12A, a piezo stack 80 has been added at the pivot position of the lever arm. A preferred piezo stack is Model P-840.10 supplied by Physik Instrumente GmbH with offices in Waldbronn, Germany.

This stack will produce linear adjustment of about 3.0 microns with a drive voltage change of 20 volts. This range is equivalent to about ±20 steps of the stepper motor.

The stack 80 responds to a control signal within less than 1 microsecond and the system can easily respond to updated signals at a frequency of 2000 Hz. In a preferred embodiment the control for each pulse at 2000 Hz pulse rate is based not on the previous pulse but the pulse prior to the previous pulse to allow plenty of time for the wavelength calculation. However, this embodiment provides a factor of 7 improvement over the prior art design with a 7 millisecond latency. Therefore, much faster feedback control can be provided. One preferred feedback control algorithm is described in FIG. 12C. In this algorithm the wavelength is measured for each pulse and an average wavelength for the last four and last two pulses is calculated. If either of the average deviate from the target wavelength by less than 0.02 pm, no adjustment is made. If both deviate more than 0.02 pm from the target, an adjustment is made to the mirror assembly by piezoelectric stack 80 to provide a wavelength correction. Which of the two averages is used is determined by how much time had elapsed since the last adjustment. The piezoelectric stack is maintained within its control range by stepping the stepper motor as the stack approaches 30 and 70 percent of its range (or to provide more available range, 45 and 55 percent could be used instead of the 30 and 70 percent range values). Since the stepper motor requires about 7 ms to complete a step, the algorithm may make several piezo adjustments during a stepper motor step.

Pulse-To-Pulse Feedback Control

Figure 13A:
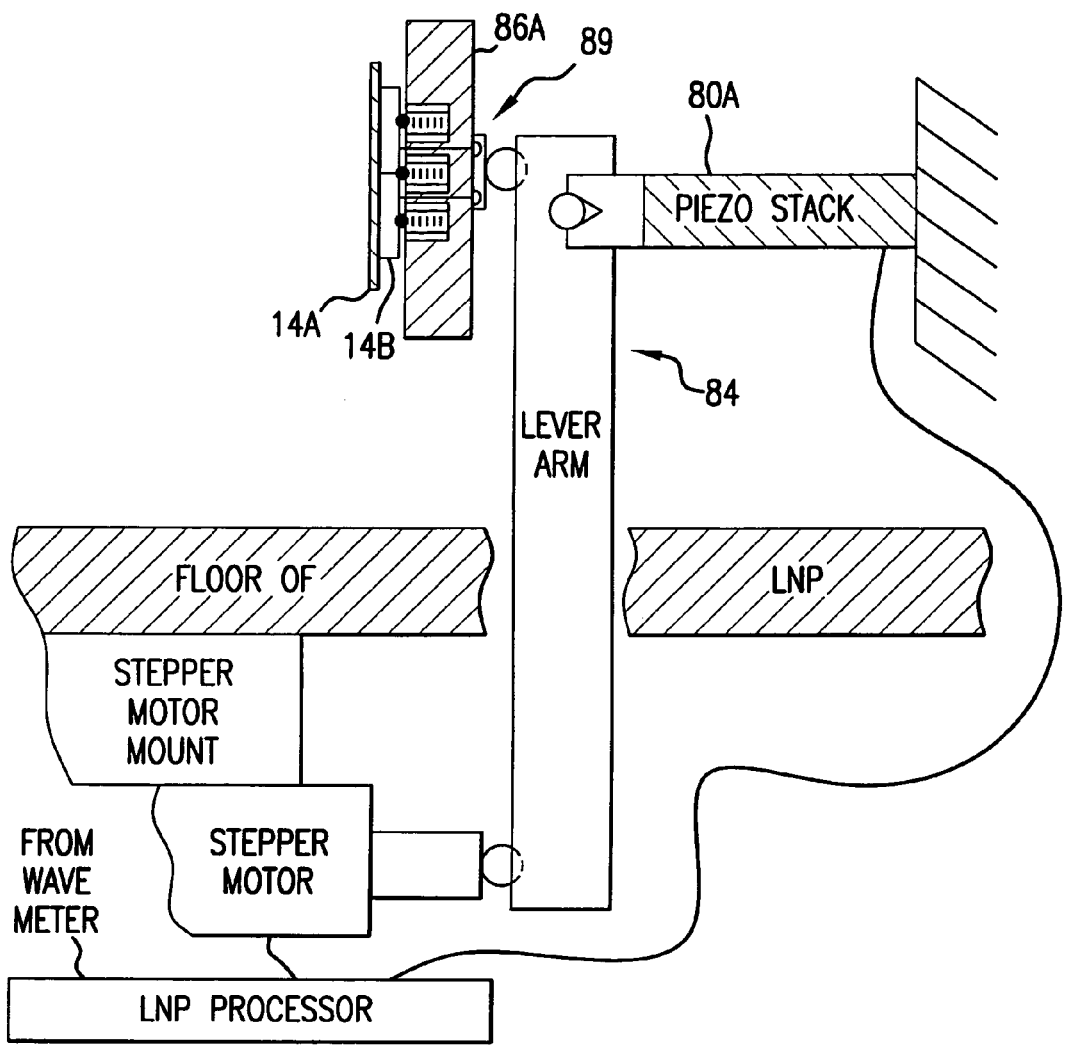
FIGS. 13A and B show further embodiments of a mirror design.
Figure 13B:
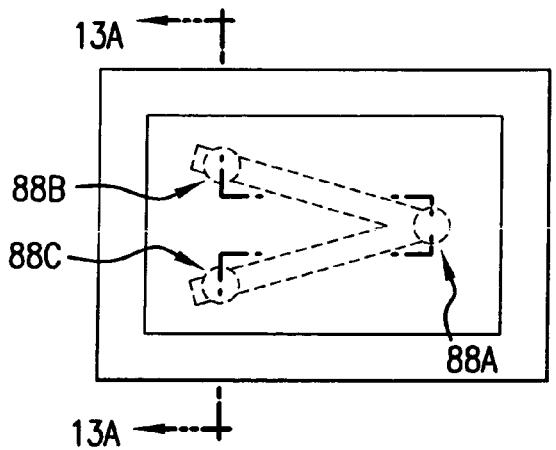

FIGS. 13A and 13B show a mirror control arrangement which permits adjustment of the mirror more quickly than 80 microseconds so that pulse-to-pulse correction is feasible at pulse repetition rates of 2000 Hz. In this case the piezoelectric stack 80 is replaced by a metal support 80A and instead piezoelectric adjustment is provided for a lightweight mirror 14A with bracing ribs 14B moving relative to the much heavier mirror mount 86A. Mirror 14A is held tightly against spherical contacts at the ends of stacks 88A, 88B and 88C by adjustable tension elements 89.

In this embodiment these piezoelectric stacks provide very fine adjustment of the position of mirror 14A relative to mirror mount 86A. As in the above example, the total adjustment range of the piezoelectric elements 88A, 88B and 88C can he very small such as about 1.5 micron since large adjustments are provided by the stepper motor. Adjustment of this lightweight mirror with the three piezo elements over very small distances such as about 0.1 microns can be extremely fast in the range of about 10 microseconds. The mirror position can be adjusted by moving drive 88A in one direction and drives 88B and 88C in the opposite direction or by moving drive 88A only. As in the prior example, preferred control algorithms outlined in FIG. 12D calls for a stepper motor step if the piezo position reaches as low as about 30 or as high as 70 percent of the control range. This provides a control range without stepper motor movement of 160 nm which is equivalent to about 0.8 pm to about 1.6 pm (depending on whether one or three piezo drivers are used). Therefore, the very fast piezo controls have a range sufficient to control substantially all chirp variations which, as indicated in FIG. 15A, are typically within the range of ±0.10 pm. Larger wavelength changes are provided by the stepper motor.

Figure 12D:
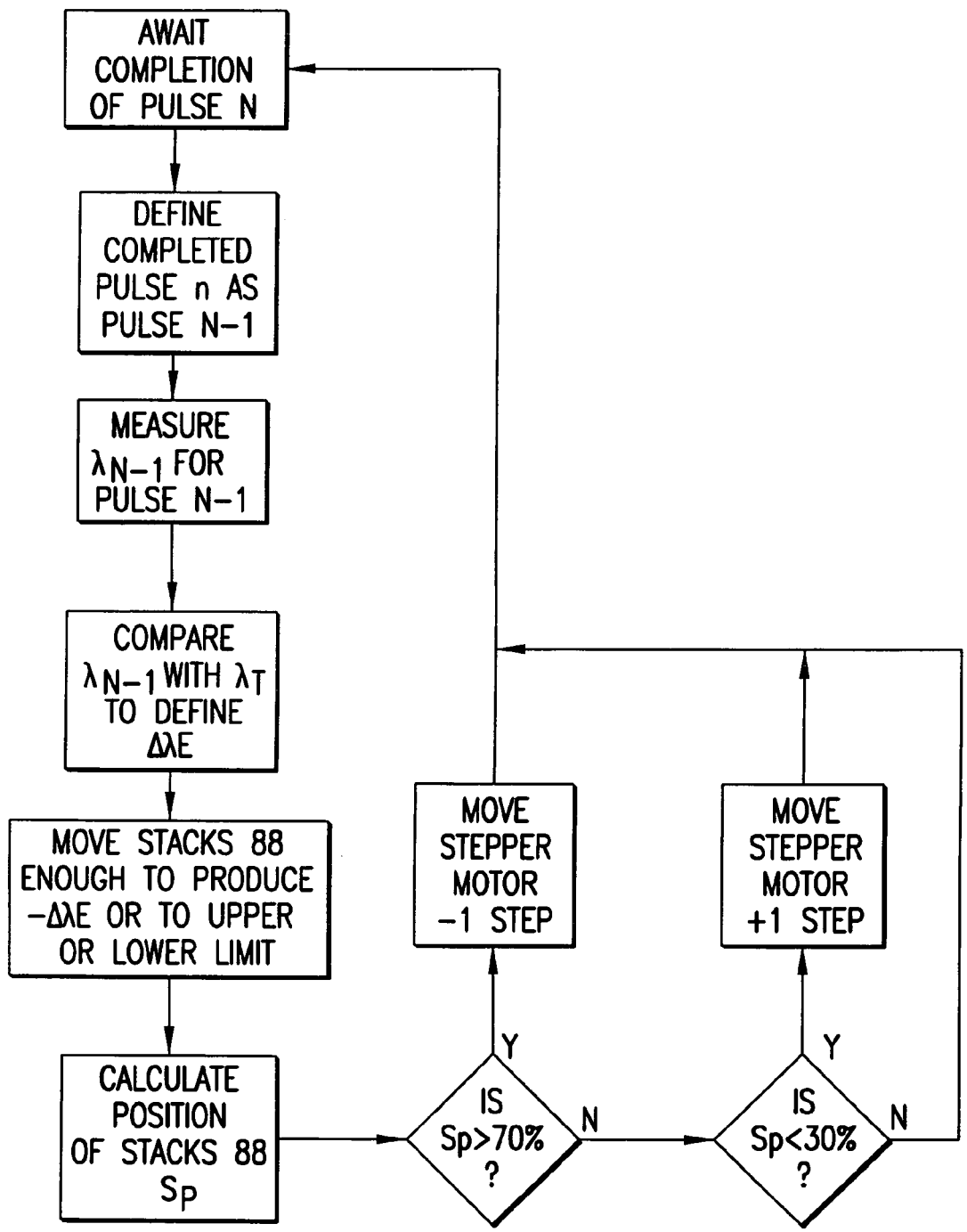

The algorithm outlined in FIG. 12D provides pulse-to-pulse control of the laser wavelength permitting next pulse correction using the very fast mirror design shown in FIGS. 13A and 13B. The algorithm as described in FIG. 12D awaits completion of a pulse N which it redefines as pulse N−1. It measures the wavelength of the pulse, compares it with a target pulse and moves stacks 88A, 88B and 88C or stack 88A to provide the desired wavelength correction. All of this is done prior to pulse N so that the mirror is moved and is stationary at the time of pulse N. If any of the stacks are outside of its 30% to 70% range, the stepper motor makes a step. The algorithm will then cause the out of range stack to move back within the 30% to 70% range. The positions of the stacks are based on their control voltage. The algorithm could be modified so that no piezoelectric adjustment is made if the absolute value of $\Delta\lambda E$ is less than a specified small value such as 0.01 pm which is 20% of one specification value for wavelength variation.

Pretuning and Active Tuning

The embodiments described above can be used for purposes other than chirp corrections. In some cases the operator of a integrated circuit lithography machine may desire to change wavelength on a predetermined basis. In other words the target wavelength $\lambda_T$ may not be a fixed wavelength but could be changed as often as desired either following a predetermined pattern or as the result of a continuously or periodically updating learning algorithm using early historical wavelength data or other parameters.

Mirror Position Determination

Figure 14:
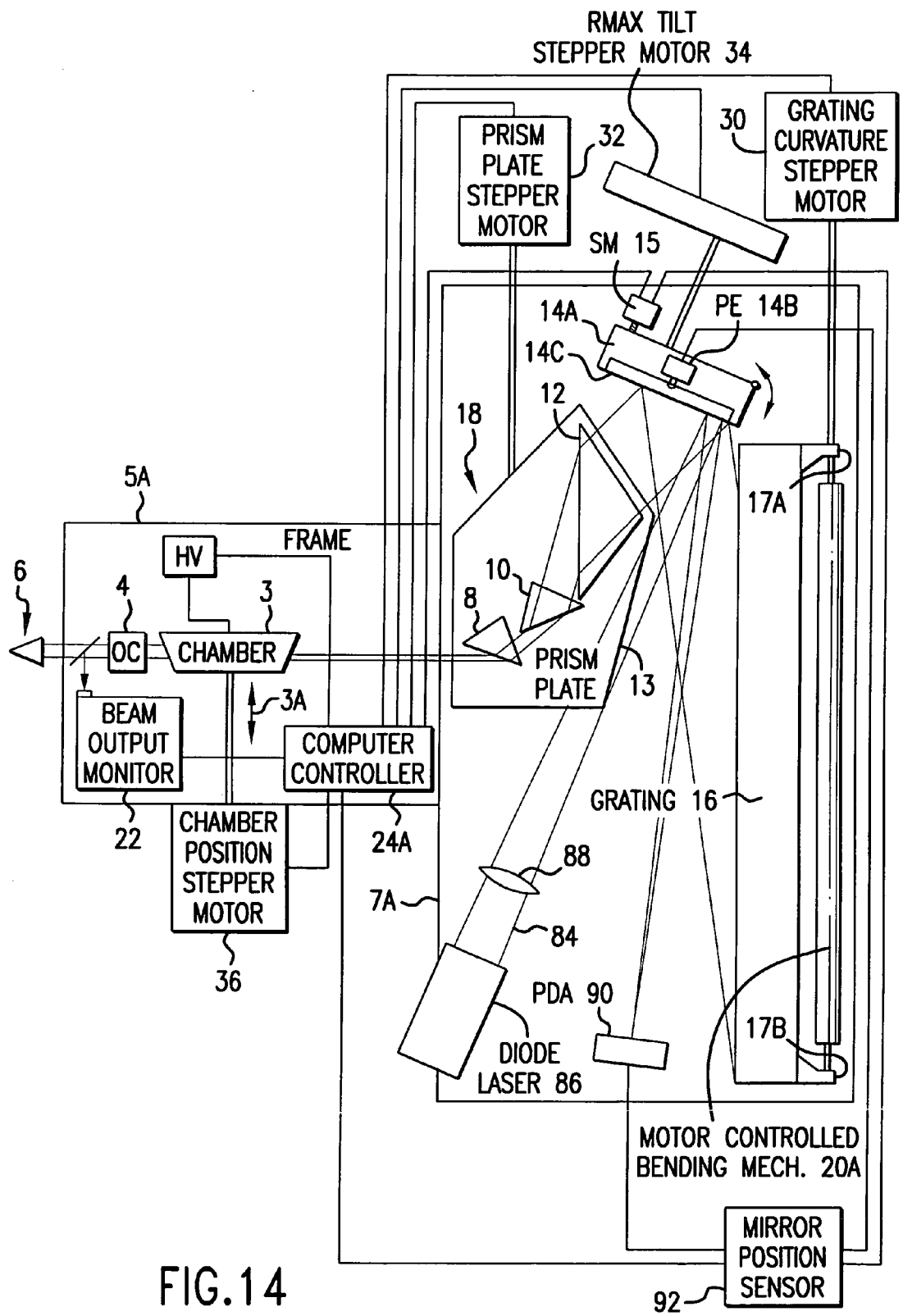
FIGS. 14, 14A and 14B show features of a preferred LNP.
Figure 14A:
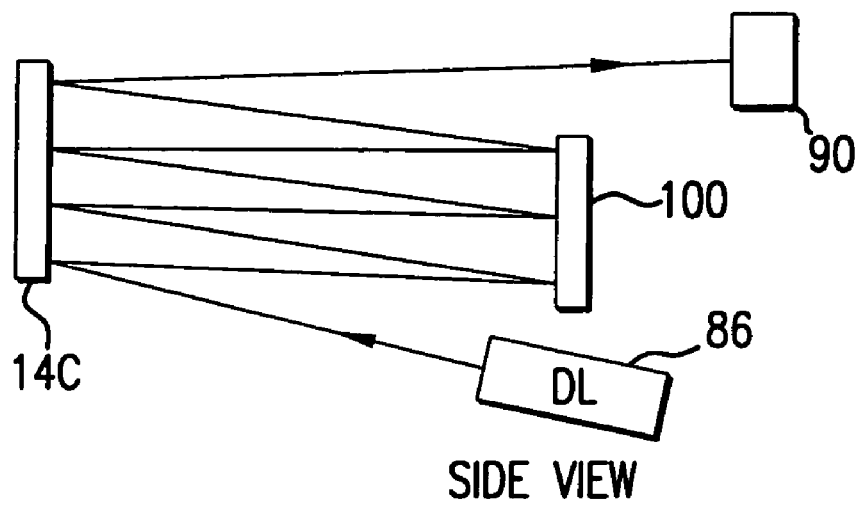
Figure 14B:
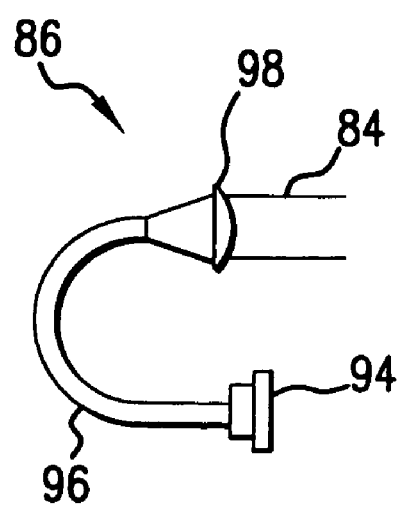

In some cases it may be desirable to control the wavelength by specifying particular mirror positions. This can be done with the embodiments shown in FIGS. 14 and 14A. In this embodiment a diode laser 86 provides as shown in FIG. 14B, a beam which is reflected off mirror 14C and the reflected beam is focused on a photodiode array 90 to determine the pivot position of mirror 14C. This arrangement permits precise positioning of the mirror without having to operate the laser for an actual wavelength measurement. This could be important when accurate prepositioning of the mirror is desired. FIG. 14B illustrates a technique of increasing the optical distance between mirror 14C and the PDA array to improve precision of the pivot measurement.

Detail Design with Piezoelectric Drive

Figure 7:
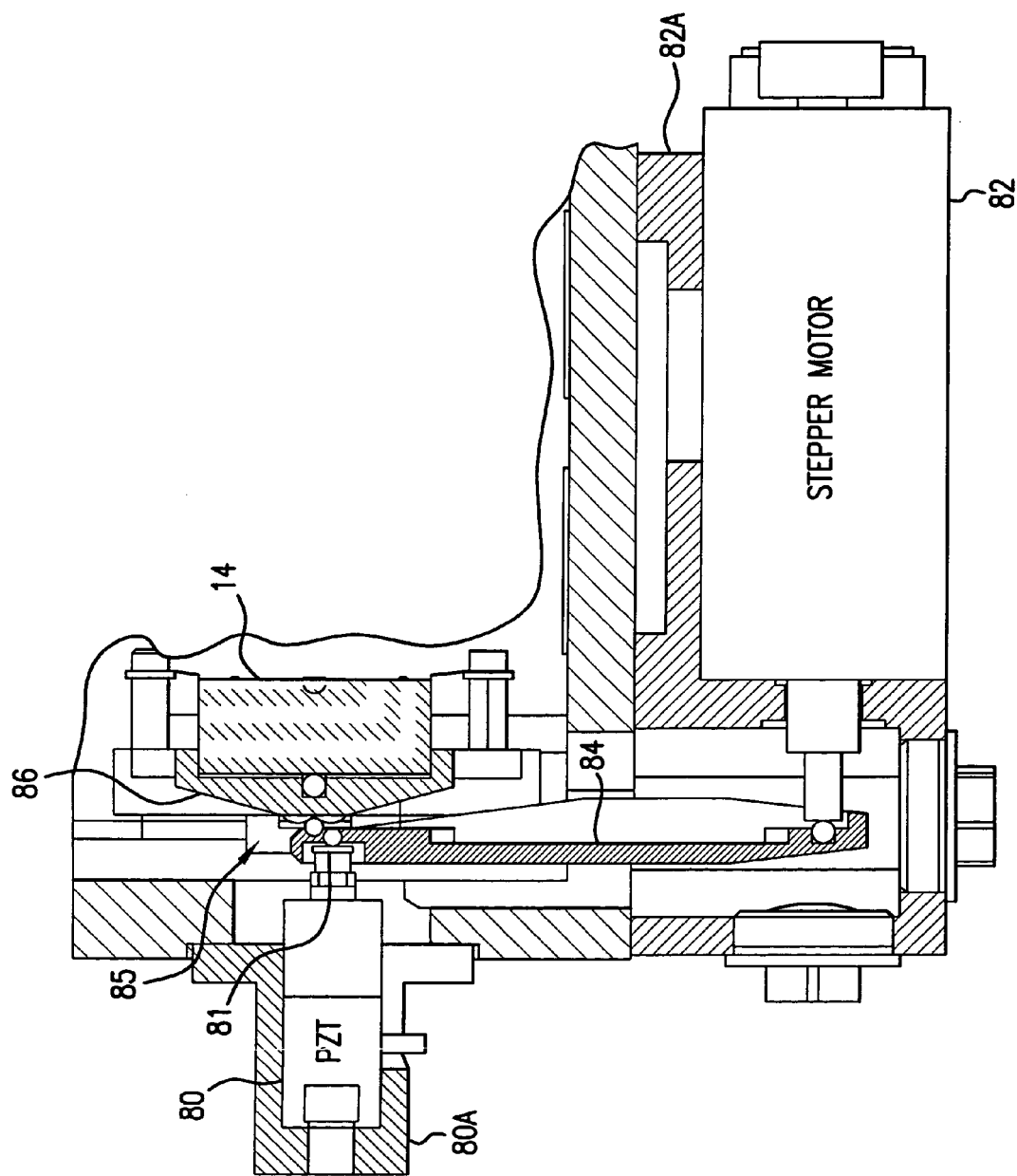
FIGS. 7 and 8 show two preferred embodiments built by Applicants.

FIG. 7 is a drawing showing detail features of a preferred embodiment of the present invention. This design is similar to the one shown in FIGS. 12A and 12B. Large changes in the position of mirror 14 are produced by stepper motor through a 26.5 to 1 lever arm 84. In this case a diamond pad 81 at the end of piezoelectric drive 80 is provided to contact spherical tooling ball at the fulcrum of lever arm 84. The contact between the top of lever arm 84 and mirror mount 86 is provided with a dow pin on the lever arm and four spherical ball bearings mounted (only two of which are shown) on the mirror mount as shown at 85. Piezoelectric drive 80 is mounted on the LNP frame with piezoelectric mount 80A and the stepper motor is mounted to the frame with stepper motor mount 82A. Mirror 14 is mounted in mirror mount 86 with a three point mount using three aluminum spheres, only one of which are shown in FIG. 7. Three springs 14A apply the compressive force to hold the mirror against the spheres.

Figure 8:
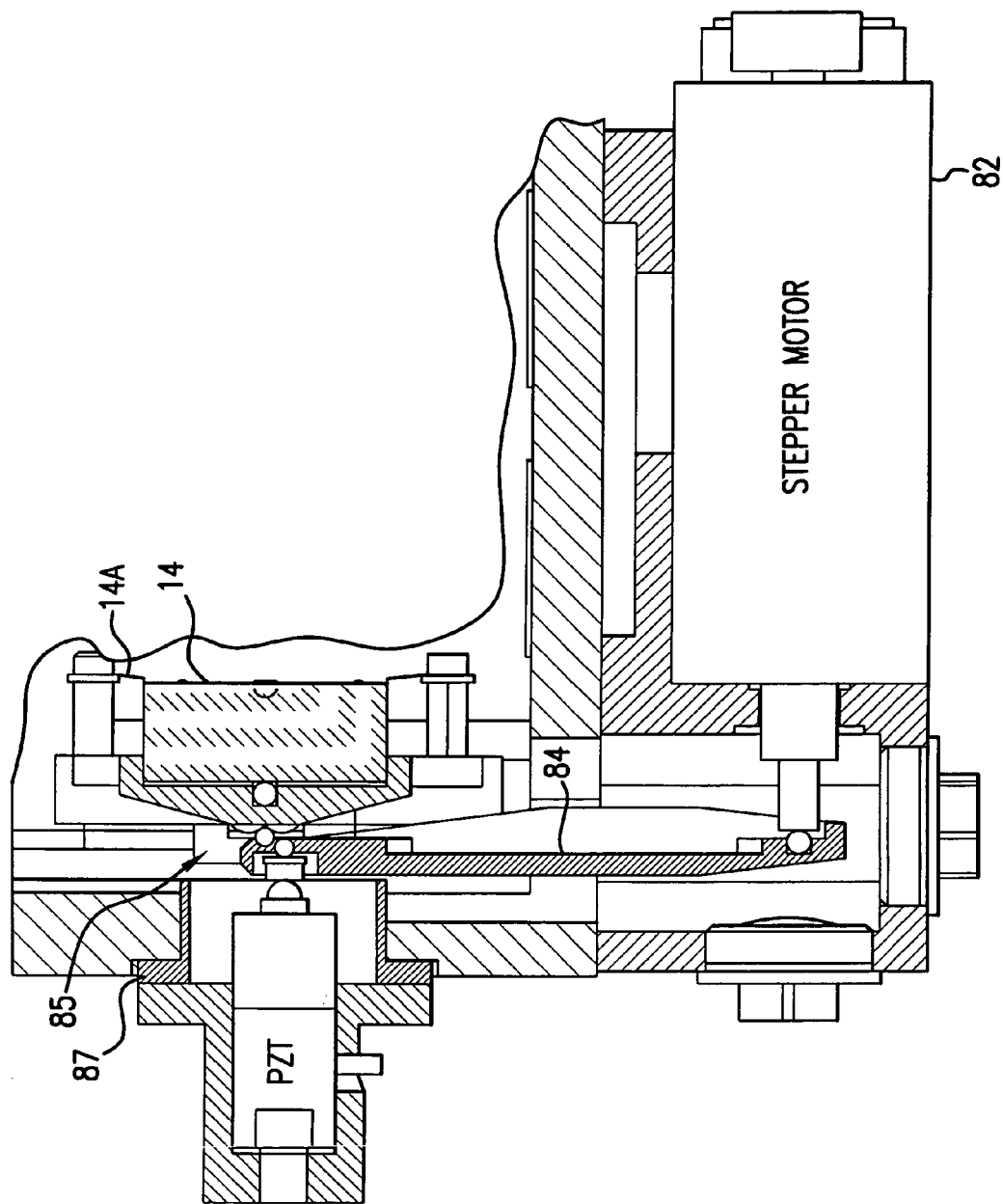
Figure 9:
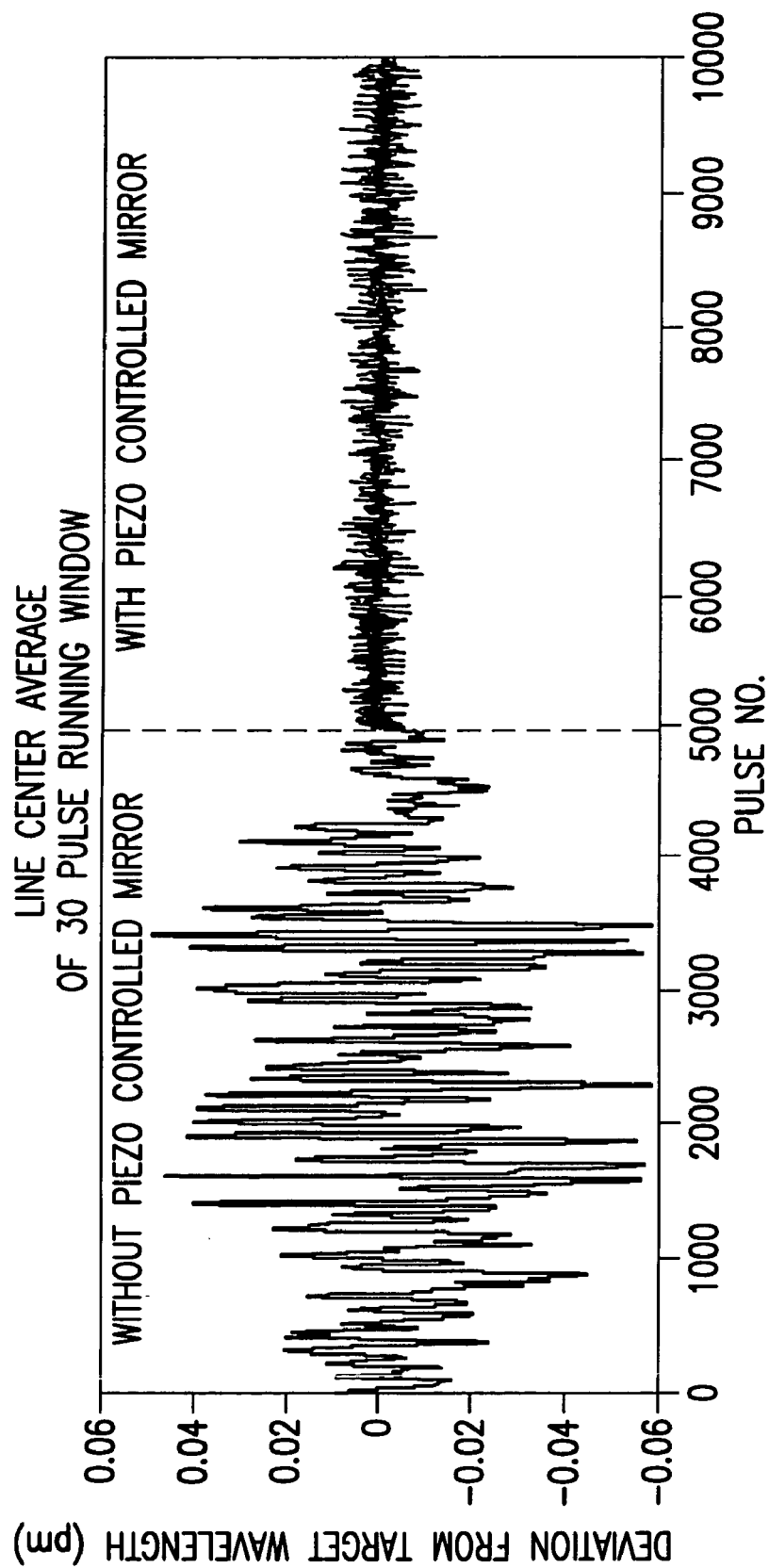
FIG. 9 shows test results.

FIG. 8 is a preferred embodiment slightly different from the one shown in FIG. 7. This embodiment includes a bellows 87 to isolate the piezoelectric drive from the environment inside the LNP. This isolation prevents UV damage to the piezoelectric element and avoid possible contamination caused by out gassing from the piezoelectric materials.

Dither Tuning Mirror to Simulate Desired Wavelength

The wavelength and bandwidth monitoring equipment and the wavelength tuning equipment described above permit bandwidth control of the laser beam.

The technique involves monitoring the bandwidth with the wavemeter shown in FIG. 6. If the bandwidth is less than the desired bandwidth the wavelength control equipment is utilized to dither mirror 14 at frequent intervals to cause very slight shifts in the spectrum on a pulse to pulse basis so that the average integrated spectrum over a window of pulses simulates approximately a constant spectrum with bandwidth approximating the desired bandwidth.

For example, if the optical equipment for a scanner is designed for a bandwidth of 0.4 pm and because of a decrease in the fluorine concentration the bandwidth of individual pulses is 0.3 pm, mirror 14 may be dithered about its nominal position to produce plus and minus shifts in the nominal wavelength of about 0.05 pm in order to maintain the same nominal wavelength with the effective increase by 0.1 pm. For a typical commercial excimer laser of the type discussed above, a change in the pivot position of mirror 14 of about 2 nm is required to produce a 0.05 pm shift in the wavelength. This change in mirror position is easily provided by the piezoelectric drivers referred to above and shown in the drawings as item 80. Typically in the integrated circuit fabrication each spot on the wafer is illuminated with a number of pulses usually in the range of about 30 to 150 pulses so that the dither rate should be sufficient so that each die spot receives about equal portions of pulses from both sides of the dither.

Thus if the number of pulses illuminating a spot is 30 the dither rate should be at least about ¼ the pulse rate. So if the pulse rate is 2000 Hz the dither rate preferably would be at least 500 Hz. This is no problem for the equipment and software referred to above.

Deformable Tuning Mirror

Figure 10:
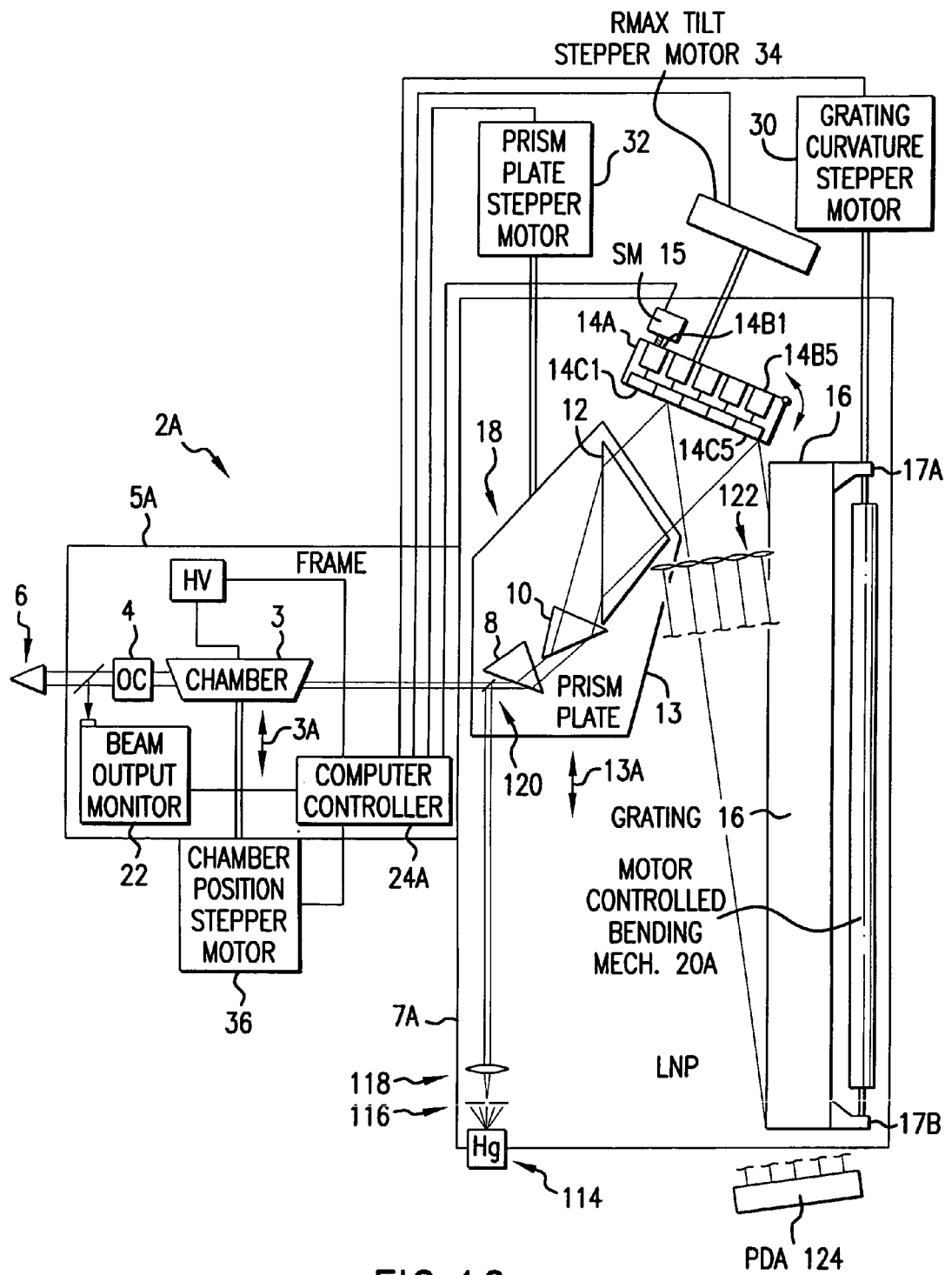
FIG. 10 shows a laser system configured in accordance with a preferred embodiment.

FIG. 10 illustrates the use of a segmented tuning mirror in which each of the 5 mirror segments is controlled by its own piezoelectric drive 14B1-5. Each of the segments can be operated very fast. This embodiment has an additional advantage of improving the bandwidth of the laser since each horizontal portion of the beam can be individually controlled. In a preferred embodiment, each segment is individually controlled with a feedback control system and software designed to maintain bandwidth within a desire range, such as within 0.03 ±0.02 pm. This embodiment also has a PDA 124 for determining the position of each segment. The light is provided by a mercury lamp 114 where the UV light is passed through a slit 116 and a columinating lens 118. The beam in this case is expanded through the same beam expander used to expand the laser beam and five small lenses focus light from each mirror on separate parts of the PDA.

Purging Grating Face

Figure 11A:
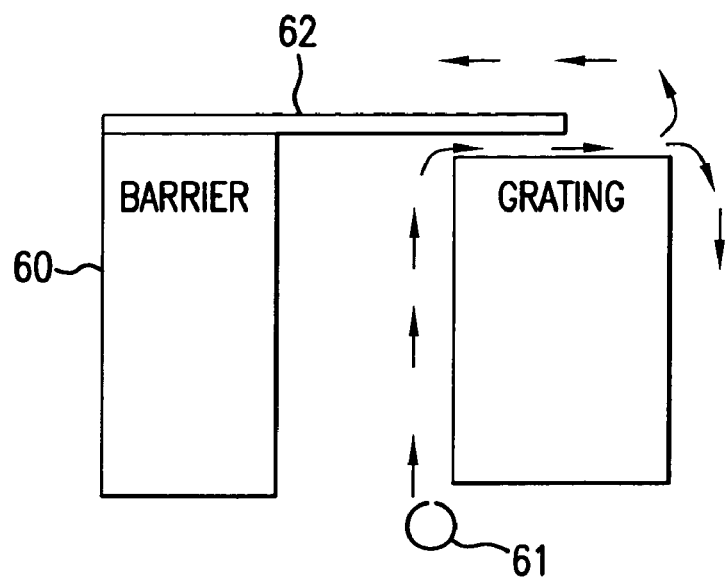
FIGS. 11A, 11B, 11C and 11D show techniques for cooling the face of a grating in a preferred embodiment.
Figure 11B:
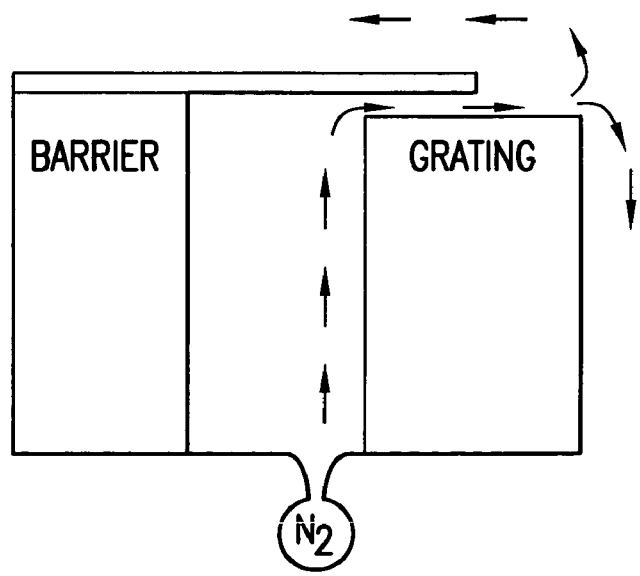
Figure 11C:
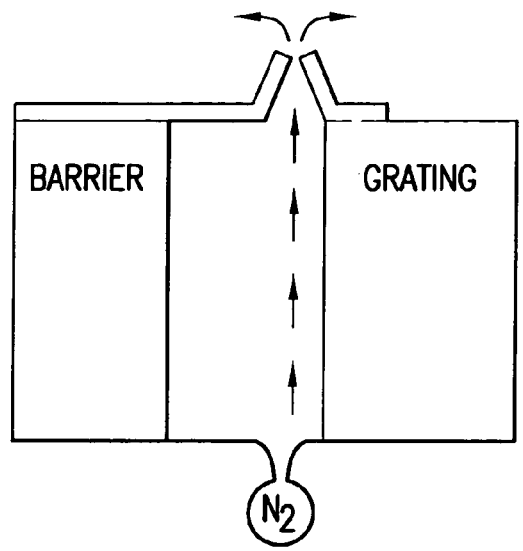
Figure 11D:
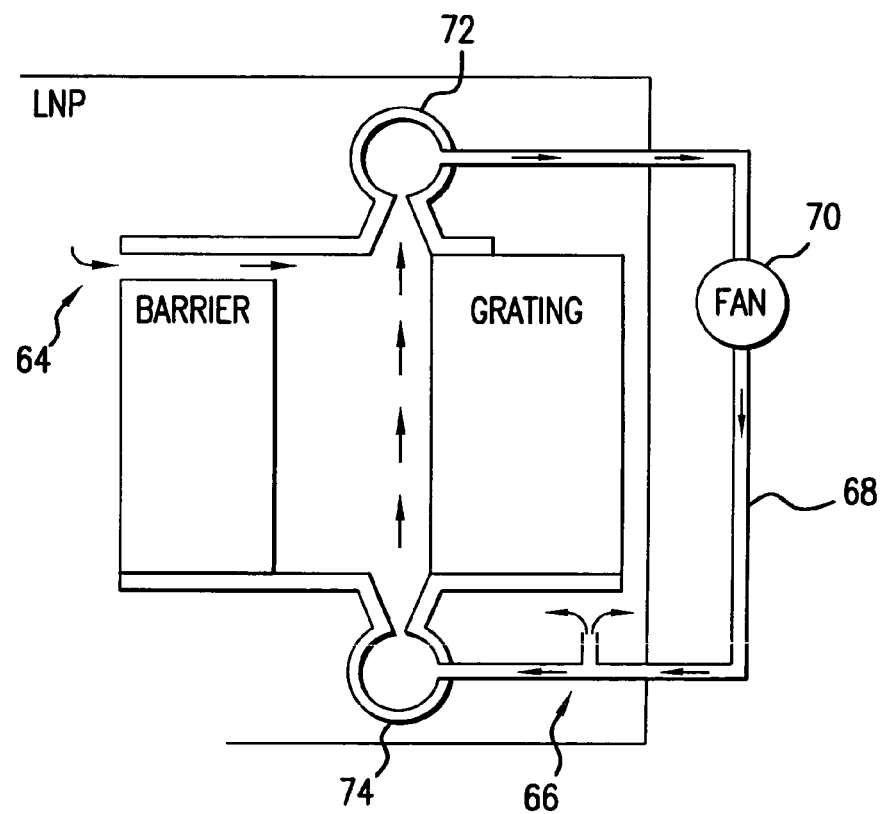

It is known to purge line narrowing packages; however, the prior art teaches keeping the purge flow from flowing directly on the grating face so that purge flow is typically provided through a port located at positions such as behind the face of the grating. Applicants have discovered, however, that at very high repetition rates a layer of hot gas (nitrogen) develops on the face of the grating distorting the wavelength. This distortion can be corrected at least in part by the active wavelength control discussed above. Another approach is to purge the face of the grating as shown in FIGS. 11A, 11B, 11C and 11D. In FIG. 11A, small holes (1 mm or ¼ inch spacings) in the top of 10-inch long ⅜ inch diameter purge tube 61 provides the purge flow. Other techniques are shown in FIGS. 11B, 11C and 11D.

While particular embodiments of the present invention have been shown and described, it will be obvious to those skilled in the art that changes and modifications may be made without departing from this invention in its broader aspects. For example, partially line narrowed lasers where the bandwidth is line narrowed with a plurality of prisms and the beam is reflected with a tuning mirror. This technique would involve dithering the tuning mirror. It should also be recognized that these dithering techniques helps to eliminate coherence problems. Therefore, the appended claims are to encompass within their scope all such changes and modifications as fall within the true spirit and scope of this invention.

We claim:

1. An apparatus for producing effective bandwidths of a pulse laser beam of a narrow band electric discharge laser having a line narrowing unit comprising a grating and a fast tuning mechanism, said apparatus comprising:
    A) a beam monitor monitoring said laser beam to determine bandwidth of individual laser pulses,
    B) a bandwidth determination mechanism determining a desired effective bandwidth for improved results in an integrated circuit lithography production operation, and-,
    C) an adjusting mechanism periodically adjusting the tuning mechanism during a series of pulses so that the nominal wavelengths of some pulses in said series of pulses are slightly longer than a target wavelength and the nominal wavelengths of some pulses in said series of pulses are slightly shorter than the target wavelength in order to produce for the series of pulses an average spectrum centered approximately at the target wavelength with, average spectral deviation from the target wavelength approximately equal to a desired deviation.

2. An apparatus as in claim 1 further comprising said line narrowing unit comprises a piezoelectric drive unit.

3. An apparatus as in claim 2 further comprising said line narrowing unit comprises a tuning mirror driven by said piezoelectric drive unit.

4. An apparatus as in claim 1 further comprising a wavemeter in which the bandwidths of individual pulses are determined by determining a slit function of a spectrometer, determining a raw data spectrum, for said laser, convolving the raw data spectrum with the slit function to produce a forward convolved spectrum, determining width for the forward convolved spectrum $W_{FC}$ and a width of the raw data spectrum $W_R$, and computing an estimate of the width of the true spectrum $W_T$ by a formula equivalent to:

$$W_T = W_R - (W_{FC} - W_R).$$

5. An apparatus as in claim 1 further comprising the line narrowing unit comprises a turning mirror and a turning mirror dithering mechanism.

6. A photo lithography light source of bursts of pulses of laser produced light having a desired nominal wavelength and subpicometer bandwidth, comprising:
   A) a wavemeter monitor monitoring the wavelength of the laser light of at least some of the pulses in each burst and providing a measured wavelength signal representative of the laser pulse wavelength;
   B) a bandwidth requirement monitor receiving a signal indicative of the desired nominal wavelength and providing a wavelength control signal representative of the desired nominal wavelength;
   C) a laser tuning mechanism substantially responsive to the measured wavelength not equaling the desired nominal wavelength adjusting the wavelength of pulses so that the nominal wavelengths of some of the pulses in the burst are slightly longer than the desired nominal wavelength and some of the pulses in the burst are slightly shorter than the desired nominal wavelength to produce a burst a pulses with an average spectrum centered approximately at the desired nominal wavelength.

7. An apparatus of claim 6, further comprising:
the burst of pulses also having an average spectral deviation from the desired nominal wavelength within a desired deviation.

8. An apparatus as in claim 6, further comprising:
the laser timing mechanism comprising a line narrowing unit with a piezoelectric drive unit.

9. An apparatus as in claim 7, further comprising:
the laser tuning mechanism comprising a line narrowing unit with a piezoelectric drive unit.

10. An apparatus as in claim 8, further comprising:
the line narrowing unit comprising a tuning mirror driver by a piezoelectric drive unit.

11. An apparatus as in claim 9, further comprising:
the line narrowing unit comprising a tuning mirror driver by a piezoelectric drive unit.

12. An apparatus as in claim 6, further comprising:
the wavemeter comprising:
a laser pulse bandwidth detector comprising;
   A) a spectrometer having a slit function;
   B) a laser pulse bandwidth spectrum detector producing a raw spectrum data signal with a slit function bandwidth parameter representative of a bandwidth parameter of a convolution of the laser pulse spectrum and the slit function,
   C) a convolver convolving the slit function bandwidth parameter with the spectrum data signal bandwidth parameter to form a forward convolved signal $W_{FC}$; and
   D) a laser pulse bandwidth estimator estimating the laser pulse bandwidth, $W_T$, according to the formula $W_T = (W_R - (W_{FC} - W_R))$.

13. A photo lithography apparatus having a single material optical image projection lens without a second material of a different refractive index comprising;
   A) a chromatic aberration correction mechanism comprising;
   B) a laser light source providing bursts of laser light pulses of a desired nominal wavelength wherein the nominal wavelengths of some of the pulses within the burst are slightly longer than the desired nominal wavelength and the nominal wavelength of some of the pulses within the burst are slightly shorter than the desired nominal wavelength such that the burst of pulses is within an average spectrum centered approximately at the desired nominal wavelength.

14. The apparatus of claim 13 further comprising the burst of pulses also having an average spectral deviation from the desired nominal wavelength within a desired deviation.

* * * * *